(12) United States Patent  
Leng

(10) Patent No.: US 12,444,677 B2  
(45) Date of Patent: Oct. 14, 2025

(54) INTEGRATED INDUCTOR INCLUDING MULTI-COMPONENT VIA LAYER INDUCTOR ELEMENT

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 658 days.

(21) Appl. No.: 17/719,586

(22) Filed: Apr. 13, 2022

(65) Prior Publication Data

US 2023/0128990 A1 Apr. 27, 2023

Related U.S. Application Data

(60) Provisional application No. 63/272,542, filed on Oct. 27, 2021.

(51) Int. Cl.

| | |
|---|---|
| *H01L 23/522* | (2006.01) |
| *H01F 17/00* | (2006.01) |
| *H01L 21/768* | (2006.01) |
| *H01L 23/528* | (2006.01) |
| *H01L 23/532* | (2006.01) |
| *H10D 1/20* | (2025.01) |

(52) U.S. Cl.
CPC ..... *H01L 23/5227* (2013.01); *H01F 17/0013* (2013.01); *H01L 21/76877* (2013.01);
(Continued)

(58) Field of Classification Search
CPC ............ H01L 23/5227; H01L 23/5223; H01L 21/76877; H01L 28/10; H01F 2017/004; H10D 1/20
See application file for complete search history.

(56) References Cited

U.S. PATENT DOCUMENTS

| 11,094,628 B2 | 8/2021 | Leng | |
| 2003/0013264 A1* | 1/2003 | Yeo | ........................ H01L 23/645 438/381 |

(Continued)

FOREIGN PATENT DOCUMENTS

| CN | 106298736 B | 11/2018 | ........... H01L 23/522 |
| EP | 1398801 A2 | 3/2004 | ............. H01F 17/00 |

(Continued)

OTHER PUBLICATIONS

International Search Report and Written Opinion, Application No. PCT/US2022/026489, 18 pages, Aug. 26, 2022.

*Primary Examiner* — Ajay Ojha
*Assistant Examiner* — Sandra Milena Rodriguez Villanu
(74) *Attorney, Agent, or Firm* — SLAYDEN GRUBERT BEARD PLLC

(57) ABSTRACT

A device includes an integrated inductor and metal interconnect formed in an integrated circuit (IC) structure. The integrated inductor includes an inductor wire having a portion defined by an inductor element stack including (a) a metal layer inductor element formed in a metal layer in the IC structure and (b) a multi-component via layer inductor element formed in a via layer in the IC structure vertically adjacent the metal layer, and conductively connected to the metal layer inductor element. The multi-component via layer inductor element includes a via layer inductor element cup-shaped component formed from a first metal, and a via layer inductor element fill component formed from a second metal in an opening defined by the via layer inductor element cup-shaped component. The metal interconnect includes a metal layer interconnect element formed in the metal layer, and an interconnect via formed in the via layer from the first metal.

20 Claims, 21 Drawing Sheets

(52) U.S. Cl.
CPC ........ *H01L 23/5226* (2013.01); *H01L 23/528* (2013.01); *H01L 23/53223* (2013.01); *H10D 1/20* (2025.01); *H01F 2017/002* (2013.01); *H01F 2017/0073* (2013.01); *H01F 2017/0086* (2013.01)

(56) References Cited

U.S. PATENT DOCUMENTS

| | | | | |
|---|---|---|---|---|
| 2004/0195652 A1* | 10/2004 | Okada | ................ | H01L 23/5227 257/E21.022 |
| 2005/0104157 A1* | 5/2005 | Coolbaugh | ......... | H01L 23/5228 257/E23.152 |
| 2007/0126543 A1* | 6/2007 | Yeh | .................... | H01F 17/0006 336/200 |
| 2008/0042280 A1* | 2/2008 | Lin | ........................ | H01L 24/28 257/751 |
| 2008/0100408 A1* | 5/2008 | Chen | .................. | H01F 17/0006 336/200 |
| 2014/0354392 A1 | 12/2014 | Cooney, III et al. | ......... | 336/200 |
| 2020/0144358 A1* | 5/2020 | Koduri | .................... | H01L 28/10 |

FOREIGN PATENT DOCUMENTS

| | | | | |
|---|---|---|---|---|
| JP | 2000124403 A | 4/2000 | ......... | H01L 21/3205 |
| KR | 20040085617 A | 10/2004 | ............. | H01L 27/02 |
| WO | 02/05298 A2 | 1/2002 | ............. | H01F 17/00 |
| WO | 2021/247094 A1 | 12/2021 | ........... | H01L 23/498 |

\* cited by examiner

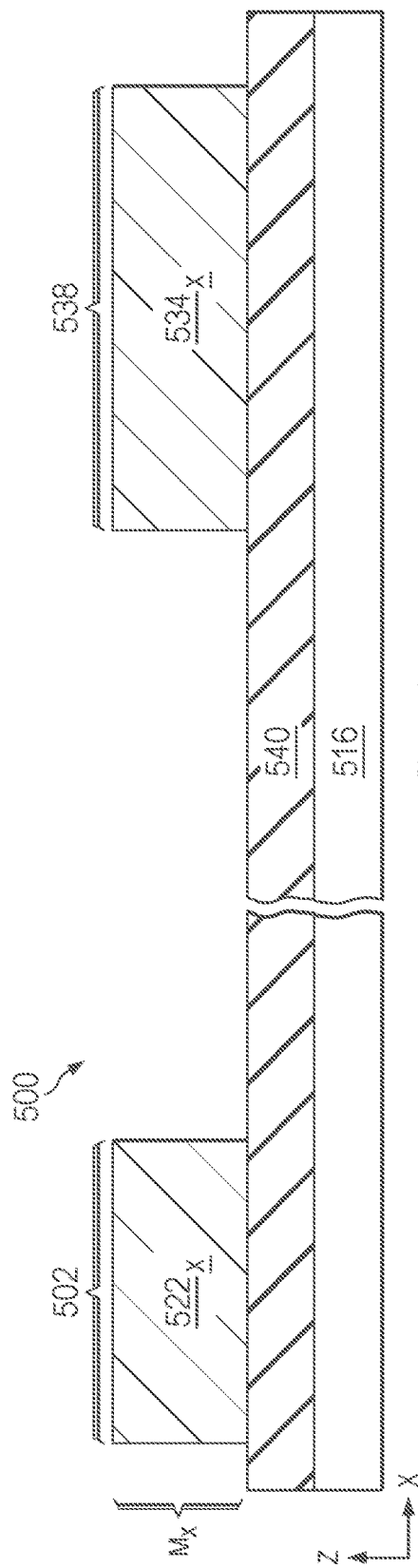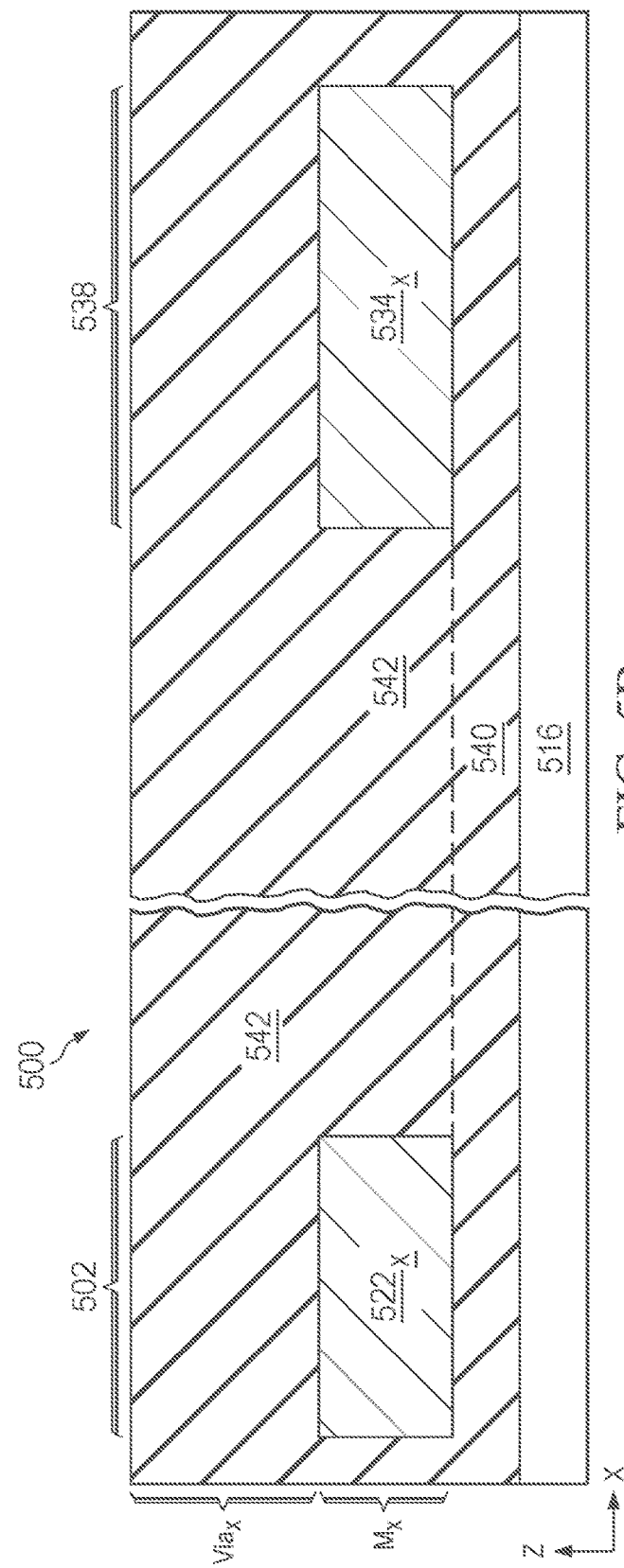

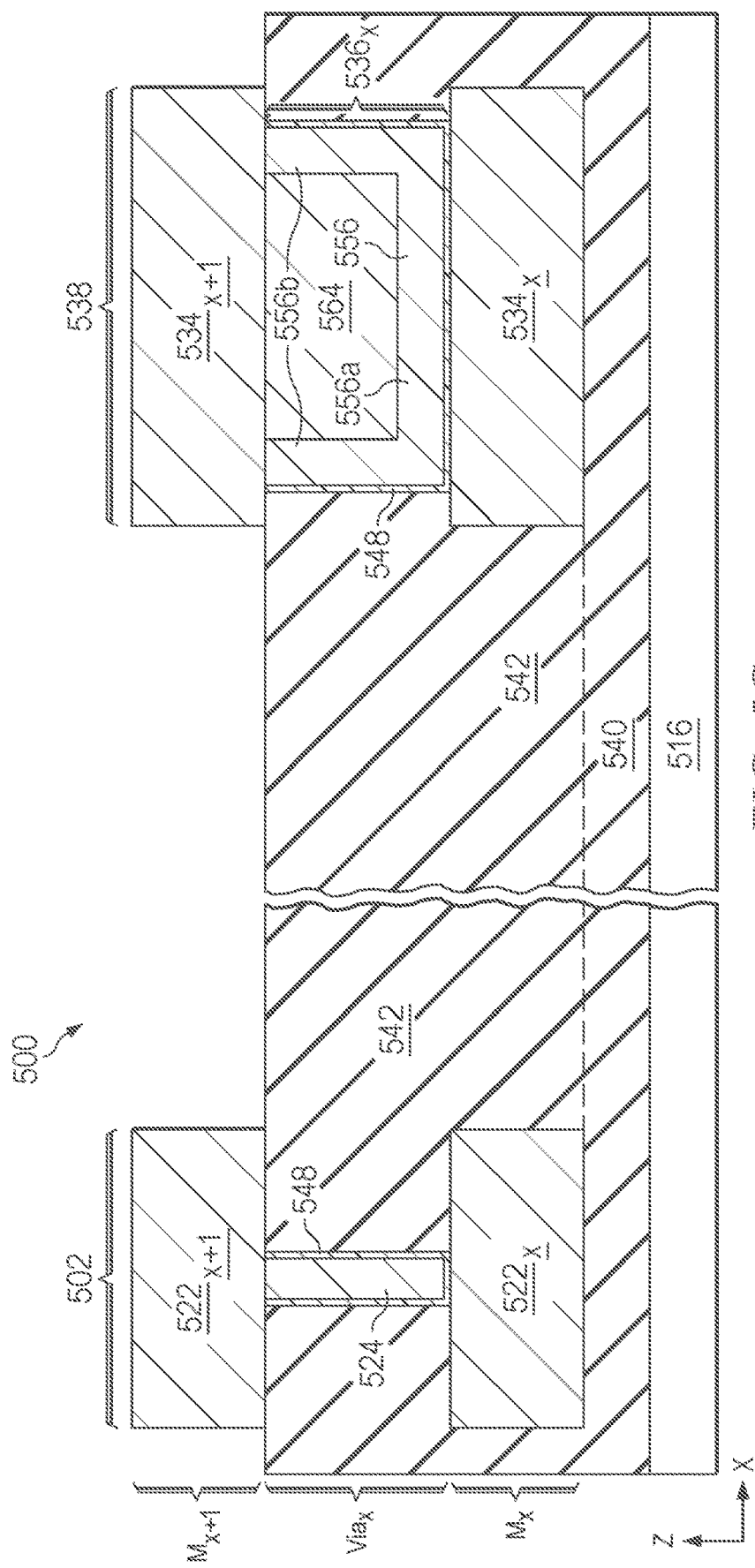

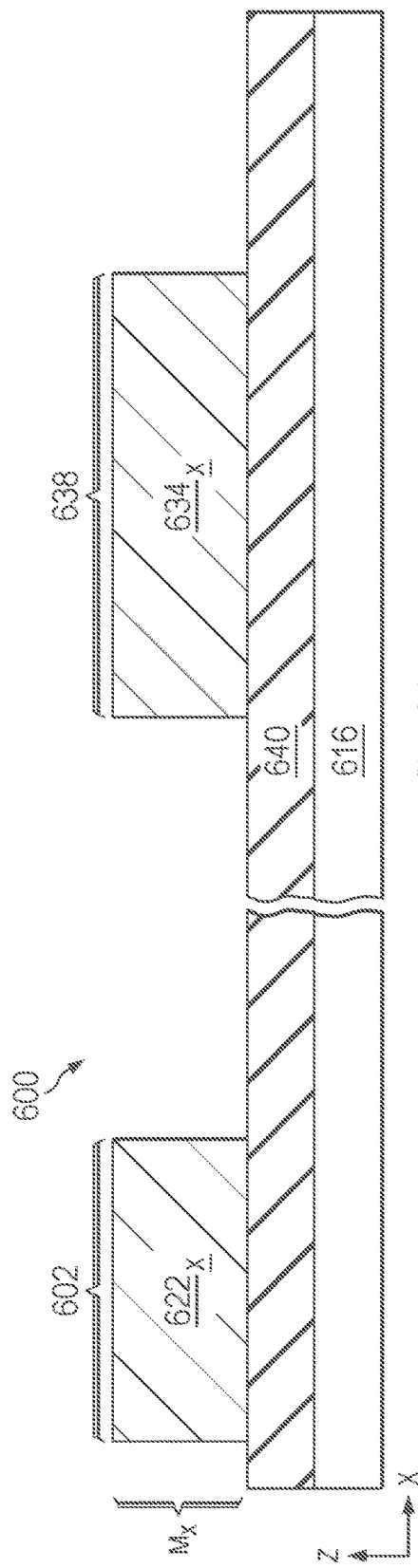
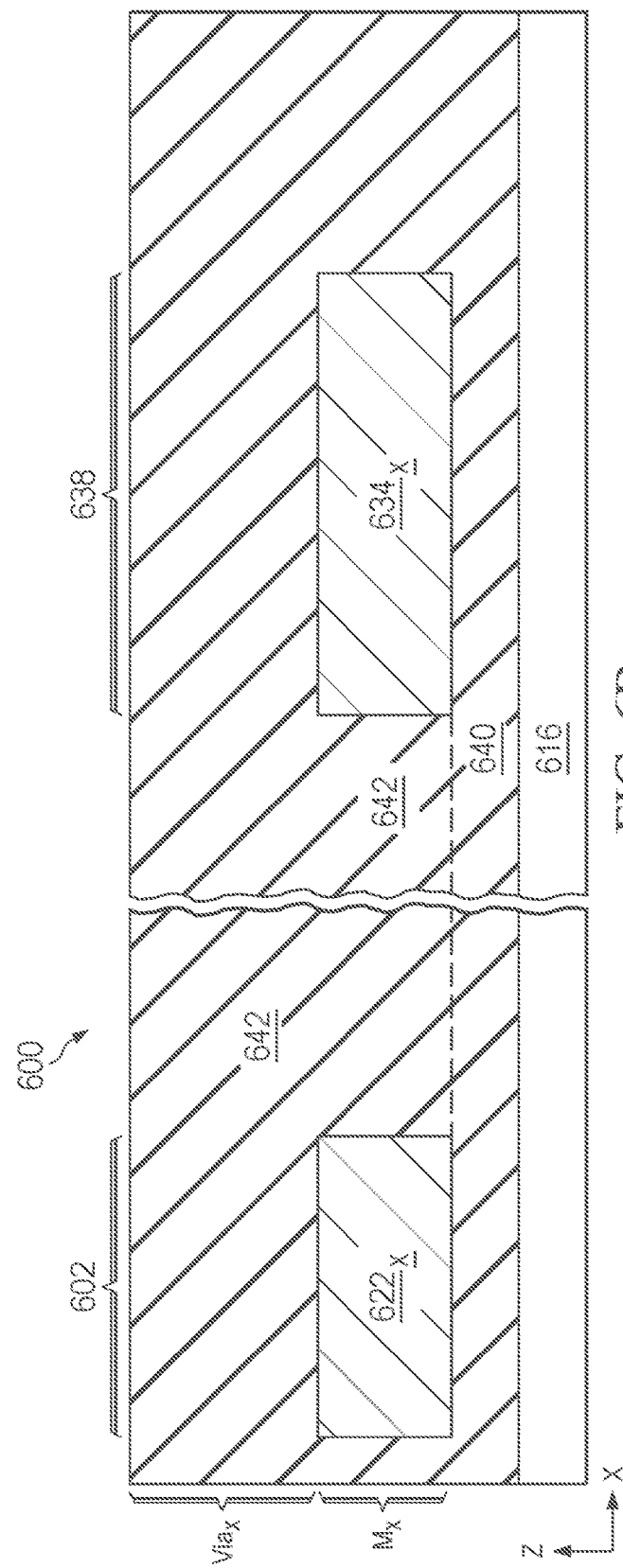
FIG. 6A
FIG. 6B

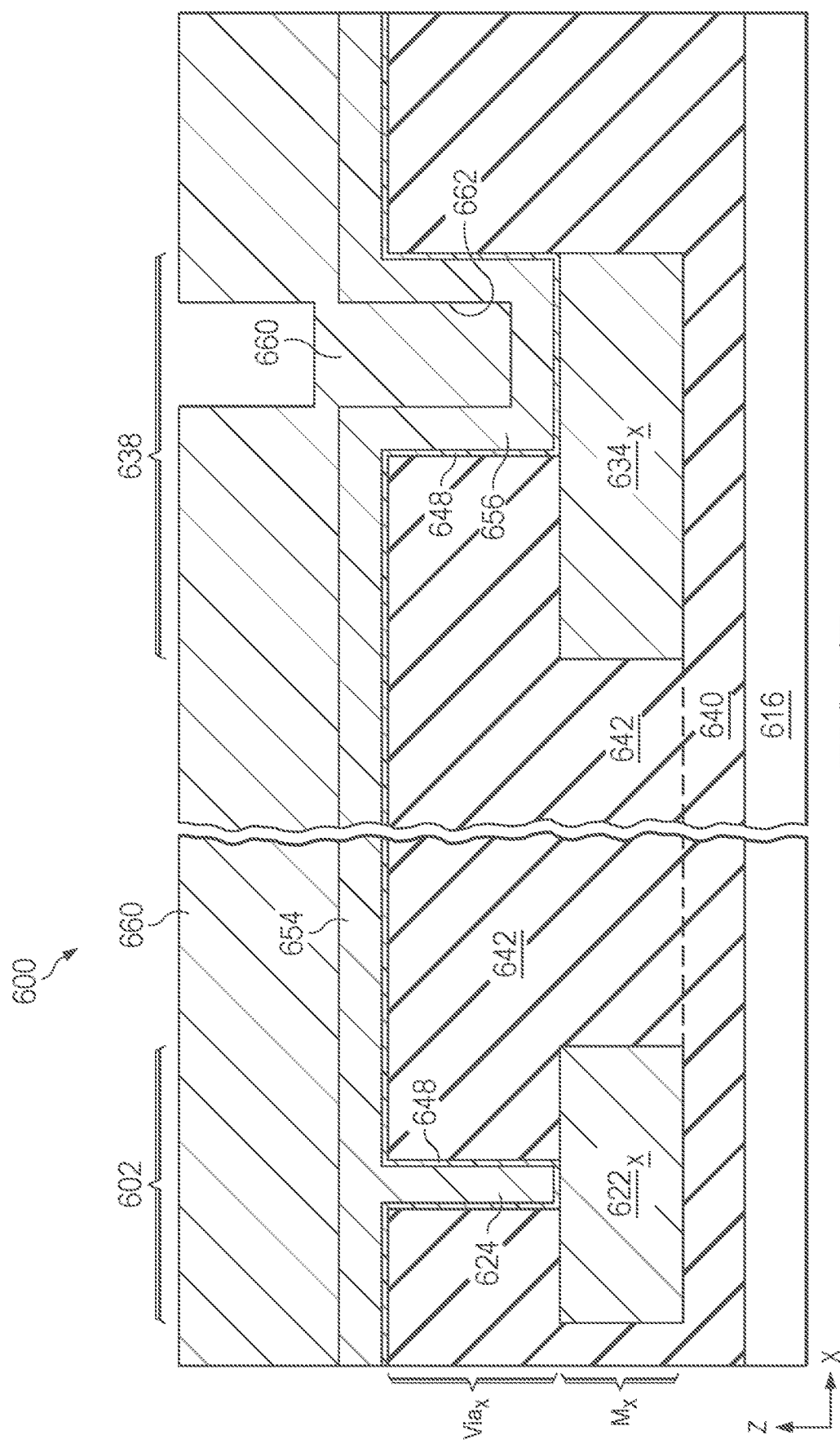

INTEGRATED INDUCTOR INCLUDING MULTI-COMPONENT VIA LAYER INDUCTOR ELEMENT

RELATED PATENT APPLICATION

This application claims priority to commonly owned U.S. Provisional Patent Application No. 63/272,542 filed Oct. 27, 2021, the entire contents of which are hereby incorporated by reference for all purposes.

TECHNICAL FIELD

The present disclosure relates to integrated circuit (IC) devices, and more particularly to an integrated inductor including a multi-component via layer inductor element.

BACKGROUND

As integrated circuits have become increasingly more complex and expensive, the semiconductor industry has adopted new technologies to manage the increased complexity inherent in large chips. One such technology is the "system on a chip" (SoC) concept, wherein a complete system is fabricated monolithically on a single silicon chip, in contrast with fabricating and mounting multiple devices on a common printed circuit board (PCB). SoCs allow users to build smaller and simpler systems based on a single chip, often resulting in a significant reduction of power usage, cost, and form factor, and improved device reliability and battery life.

An SoC may include one or more types of electronic devices, for example transistors, capacitors, resistors, and/or inductors. An inductor formed in an SoC is referred to herein as an "integrated circuit inductor" or simply "integrated inductor." Integrated inductors have a wide range of applications. For example, integrated inductors are useful in radio frequency (RF) and millimeter-wave circuits (e.g., used in mobile devices) in which high-frequency operation requires small inductance, as compared with PCB-mounted inductors which are often overwhelmed by parasitic effects. Integrated inductors are also particularly suitable for low-noise amplifiers (LNAs), resonant load and matching network applications, and RF filters. As another example, integrated inductors are very useful for constructing a power supply on a chip (PowerSoC), for example in a power management device (e.g., DC-DC converter). Such integrated inductors may be used in integrated voltage regulators (IVRs) and switch mode power supplies (SMPSs), such as buck-boost converters, for example.

However, although integrated inductors are useful in many different applications, they are typically difficult to manufacture, e.g., as compared with resistors and capacitors constructed in SoCs.

Conventional integrated inductors are typically constructed with thick wires using customized processes, i.e., with a dedicated extra thick metal layer, and are thus relatively expensive. The thick wire inductor provides certain performance benefits. In particular, increased wire thickness reduces resistance, which improves the quality factor (Q) of a typical integrated inductor. The quality factor Q of an inductor may be represented by Equation 1:

$$Q = \omega * L/R \qquad (1)$$

where ω represents angular frequency, L represents inductance, and R represents series resistance. ACCording to Equation 1, reducing the resistance increases the inductor quality factor Q. There is a need for high-performance integrated inductors having low wire resistance and at low cost, e.g., by constructing such integrated inductors concurrently with other interconnect structures.

SUMMARY

The present disclosure provides an integrated inductor having an inductor wire formed in an integrated circuit layer stack including alternating metal layers and via layers, the inductor wire being of low-resistance. At least a portion of the inductor wire is defined by an inductor element stack including a metal layer inductor element formed in a respective metal layer, and a via layer inductor element formed in a respective via layer and conductively connected to the metal layer inductor element, wherein the via layer inductor element has a length of at least 1 μm, at least 2 μm, at least 5 μm, at least 10 μm, or at least 100 μm in at least one lateral direction (e.g., an x-direction and/or y-direction perpendicular to a vertical z-direction). In some examples, the integrated inductor is formed concurrently with a metal interconnect structure including a metal layer interconnect elements formed in the respective metal layers and an interconnect via formed in the respective via layer.

In some examples, a respective via layer inductor element is formed with multiple components, and thus referred to as a "multi-component via layer inductor element." Via layer inductor elements may be formed as multi-component via layer inductor elements based on material properties of particular material(s), e.g., tungsten, used in the construction of the relevant device, as discussed below.

For example, as noted above, the integrated inductor may be formed concurrently with a metal interconnect structure including (a) a metal layer interconnect element formed in a common metal layer with a metal layer inductor element of the integrated inductor and (b) an interconnect via formed in a common via layer with a via layer inductor element of the integrated inductor. The via layer inductor element may be large relative to the interconnect via, to allow the formation of a low-resistance integrated inductor wire, e.g., having a sheet resistance of less than 10 mΩ/sq, or less than 3 mΩ/sq, depending on the particular example. For example, the via layer inductor element (as well as the metal layer inductor element) may have a length of at least 1 μm, at least 2 μm, at least 5 μm, at least 10 μm, or at least 100 μm in at least one lateral direction (e.g., an x-direction and/or y-direction perpendicular to a vertical z-direction), while the interconnect via may have a narrower shape, e.g., with a length of less than 0.5 μm in both lateral directions (e.g., x-direction and y-direction). As used herein, a "length" refers to a linear distance in a respective direction, e.g., in an x-direction (parallel with an x-axis), a y-direction (parallel with a y-axis), a z-direction (parallel with a z-axis), or other defined direction.

In some examples, the metal used to form the (narrow) interconnect via may be unsuitable for forming the (larger) via layer inductor element in the same via layer. For example, the interconnect via may be formed from tungsten, but tungsten may not be suitable for the via layer inductor element, as inherent stresses in deposited tungsten can result in structural problems when deposited in a larger volume. Thus, to avoid or reduce such problems, the via layer inductor element may be formed as a "multi-component via layer inductor element" including (a) a thin (e.g., less than 5000 Å thick) tungsten component formed concurrently with formation of the interconnect via and (b) a fill component, e.g., comprising aluminum or titanium nitride, formed over the tungsten component.

In some examples, the multi-component via layer inductor element and interconnect via may be formed together in a respective via layer by a process including:

(a) depositing a first metal (e.g., tungsten) to (i) form the interconnect via in an interconnect via opening and (ii) partially fill a separate tub opening to define a cup-shaped component of the via layer inductor element ("via layer inductor element cup-shaped component") in the tub opening, and (b) depositing a second metal (e.g., aluminum or titanium nitride) over the first metal (e.g., tungsten) to fill an opening defined by the via layer inductor element cup-shaped component, wherein the deposited second metal defines a "via layer inductor element fill component."

Thus, the resulting multi-component via layer inductor element (formed concurrently with the interconnect via) includes the via layer inductor element cup-shaped component (e.g., comprising tungsten) and the via layer inductor element fill component (e.g., comprising aluminum or titanium nitride).

In some examples, aluminum may provide various advantages as the fill metal for forming the via layer inductor element fill component. In some examples, aluminum may provide advantages over copper for use as the fill metal (i.e., for forming the via layer inductor element fill component). For example, using aluminum as the fill metal may provide significant cost savings as compared to copper. For example, using copper as the fill metal may present adhesion difficulties, which may require the addition of a barrier layer (e.g., a Ta/TaN bilayer) or other feature to improve adhesion between the different metal components. As another example, a CMP process involved in the construction may introduce additional challenges, as copper is generally more susceptible to corrosion than aluminum. For instance, it may be necessary to cap a copper fill element immediately after a copper CMP process. In addition, for a fabrication plant or facility configured for aluminum interconnect capability, it may provide significant cost savings to use aluminum (e.g., rather than copper) for the via layer inductor element fill component, e.g., by avoiding the cost of adding various tooling and process steps for copper functionality, as aluminum back-end-of-line (BEOL) tools and copper BEOL tools are generally not compatible or exchangeable.

However, in other examples, copper may be used (e.g., instead of aluminum) as the fill metal for forming the via layer inductor element fill component.

In some examples, the inductor wire of the integrated inductor may define a magnetic B-field extending parallel to an underlying silicon substrate. In other examples, the inductor wire of the integrated inductor may define a magnetic B-field extending perpendicular to an underlying silicon substrate.

In some examples, the inductor wire may include (a) a laterally-extending lower wire segment formed in the IC layer stack, (b) a laterally-extending upper wire segment formed in the IC layer stack, and (c) a vertically-extending wire segment formed in the IC layer stack conductively connecting the laterally-extending lower wire segment with the laterally-extending upper wire segment. The vertically-extending wire segment comprises an inductor element stack including (a) at least one metal layer inductor element formed in at least one respective metal layer in the IC layer stack and (b) at least one multi-component via layer inductor element formed in at least one respective via layer adjacent the respective metal layer. In some examples such inductor wire may have a spiral shape defining a magnetic B-field extending parallel to an underlying substrate, e.g., silicon substrate. As discussed above, each multi-component via layer inductor element may include a via layer inductor element cup-shaped component formed from a first metal (e.g., tungsten or other conformal metal) and (b) a via layer inductor element fill component formed from a second metal (e.g., aluminum or titanium nitride).

In some examples, the integrated inductor may be formed without adding photolithographic mask steps to the background IC fabrication process. For example, an integrated inductor may be built concurrently with aluminum interconnect structures without any additional mask steps to the background IC fabrication process.

One aspect provides a device including an IC structure including multiple metal layers and multiple via layers formed in an alternating manner in a vertical direction, with respective via layers located between a respective pair of the metal layers. The device includes an integrated inductor comprising an inductor wire, wherein at least a portion of the inductor wire is defined by an inductor element stack including (a) a metal layer inductor element formed in a respective metal layer in the IC structure and (b) a multi-component via layer inductor element formed in a respective via layer in the IC structure vertically adjacent the respective metal layer, the multi-component via layer inductor element conductively connected to the metal layer inductor element. The multi-component via layer inductor element includes (a) a via layer inductor element cup-shaped component formed from a first metal, and (b) a via layer inductor element fill component formed from a second metal different than the first metal, the via layer inductor element fill component formed in an opening defined by the via layer inductor element cup-shaped component. The metal interconnect structure includes (a) a metal layer interconnect element formed in the respective metal layer, and (b) an interconnect via formed in the respective via layer and conductively coupled to the metal layer interconnect element, the interconnect via formed from the first metal.

In some examples, the first metal comprises tungsten, and the second metal comprises aluminum or titanium nitride.

In some examples, the metal layer inductor element, the metal layer interconnect element, and the via layer inductor element fill component are formed from aluminum or titanium nitride.

In some examples, the multi-component via layer inductor element has a length of at least 1 µm in each of two lateral directions orthogonal to each other and perpendicular to the vertical direction. For example, in some examples the interconnect via has a length less than 1 µm in at least one of the two lateral directions.

In some examples, the multi-component via layer inductor element has a length greater than 2 µm in each of two lateral directions orthogonal to each other and perpendicular to the vertical direction, and the interconnect via has length less than 0.5 µm in at least one of the two lateral directions.

In some examples, the inductor wire has a sheet resistance of less than 10 mΩ/sq. In some examples, the inductor wire has a sheet resistance of less than 3 mΩ/sq.

In some examples, the inductor element stack including the metal layer inductor element and the multi-component via layer inductor element defines a diagonally-extending wire segment of the inductor wire, the diagonally-extending wire segment extending diagonally with respect to the vertical direction.

In some examples, the integrated inductor comprises a spiral inductor, wherein the inductor wire has a spiral shape.

In some examples, the inductor element stack is formed over a silicon substrate, and a magnetic B-field of the integrated inductor extends parallel to the silicon substrate.

In some examples, the inductor element stack is formed over a silicon substrate, and a magnetic B-field of the integrated inductor extends perpendicular to the silicon substrate.

Another aspect provides a method including (a) forming, in a metal layer of an integrated circuit (IC) structure, (i) a metal layer interconnect element of a metal interconnect structure and (ii) a metal layer inductor element of an integrated inductor, and (b) forming, in a via layer adjacent the metal layer in a vertical direction, (i) an interconnect via of the metal interconnect structure and (ii) a multi-component via layer inductor element of the integrated inductor wire. The interconnect via and multi-component via layer inductor element are formed by a process including (a) forming multiple via layer openings in a dielectric region, the multiple via layer openings including an interconnect via opening and a tub opening, wherein the tub opening has a length of at least 1 μm in each of two lateral directions orthogonal to each other and perpendicular to the vertical direction, and the interconnect via has a length of less than 1 μm in at least one of the two lateral directions, (b) depositing a conformal metal over the dielectric region and extending (a) into the interconnect via opening to form an interconnect via and (b) into the tub opening to form a via layer inductor element cup-shaped component, (c) depositing a fill metal over the conformal metal and extending into an interior opening defined by the via layer inductor element cup-shaped component to form a via layer inductor element fill component, and (d) removing portions of the conformal metal and the fill metal outside the via layer openings.

In some examples, the method includes forming the interconnect element and the multi-component via layer inductor element in the respective via layer by a single damascene process.

In some examples, the conformal metal comprises tungsten, and the fill metal comprises aluminum or titanium nitride.

In some examples, the method includes forming, in a further metal layer located above the respective via layer, a further metal layer inductor element conductively connected with the multi-component via layer inductor element. The further metal layer inductor element may fully cover an outer perimeter of a top surface of the multi-component via layer inductor element, and extend beyond the outer perimeter of the top surface of the multi-component via layer inductor element by at least 1 μm in at least one of the two lateral directions.

Another aspect provides a device including an IC layer stack formed over a silicon substrate, the IC layer stack including multiple metal layers and multiple via layers formed in an alternating manner in a vertical direction, with respective via layers located between a respective pair of the metal layers. The device includes an integrated inductor including a lower laterally-extending wire segment formed in the IC layer stack, an upper laterally-extending wire segment formed in the IC layer stack, and a vertically-extending wire segment formed in the IC layer stack and conductively connecting the lower laterally-extending wire segment with the upper laterally-extending wire segment. The vertically-extending wire segment comprises an inductor element stack including (a) a metal layer inductor element formed in a respective metal layer in the IC layer stack, and (b) a multi-component via layer inductor element formed in a respective via layer adjacent the respective metal layer and conductively connected to the metal layer inductor element. The multi-component via layer inductor element includes (a) a via layer inductor element cup-shaped component formed from a first metal, and (b) a via layer inductor element fill component formed from a second metal, the fill component formed in an opening defined by the cup-shaped component.

In some examples, the vertically-extending wire segment extends diagonally with respect to the vertical direction.

In some examples, the multi-component via layer inductor element has a length of at least 1 μm in each of two lateral directions orthogonal to each other and perpendicular to the vertical direction.

In some examples, the inductor wire defines a magnetic B-field extending parallel to the silicon substrate.

BRIEF DESCRIPTION OF THE DRAWINGS

Example aspects of the present disclosure are described below in conjunction with the figures, in which:

FIGS. 5A-5G show an example process for constructing a vertically-extending inductor element stack concurrently with a typical interconnect structure; and FIGS. 6A-6G show an example process for constructing a diagonally extending (e.g., vertically and laterally-extending) inductor element stack concurrently with a typical interconnect structure.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
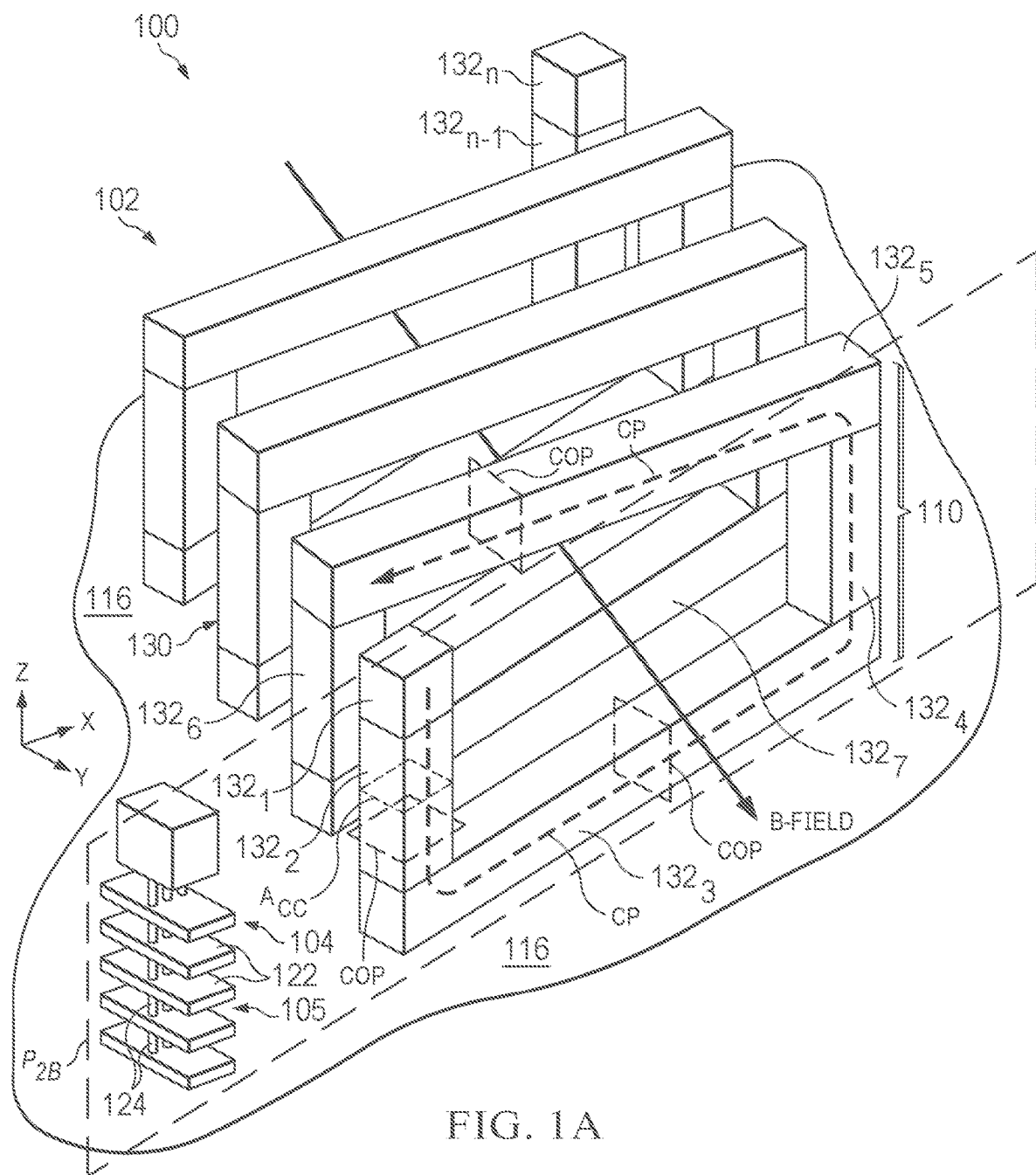
FIGS. 1A and 1B show an IC device including an example integrated inductor and an example metal interconnect structure.
Figure 1B:
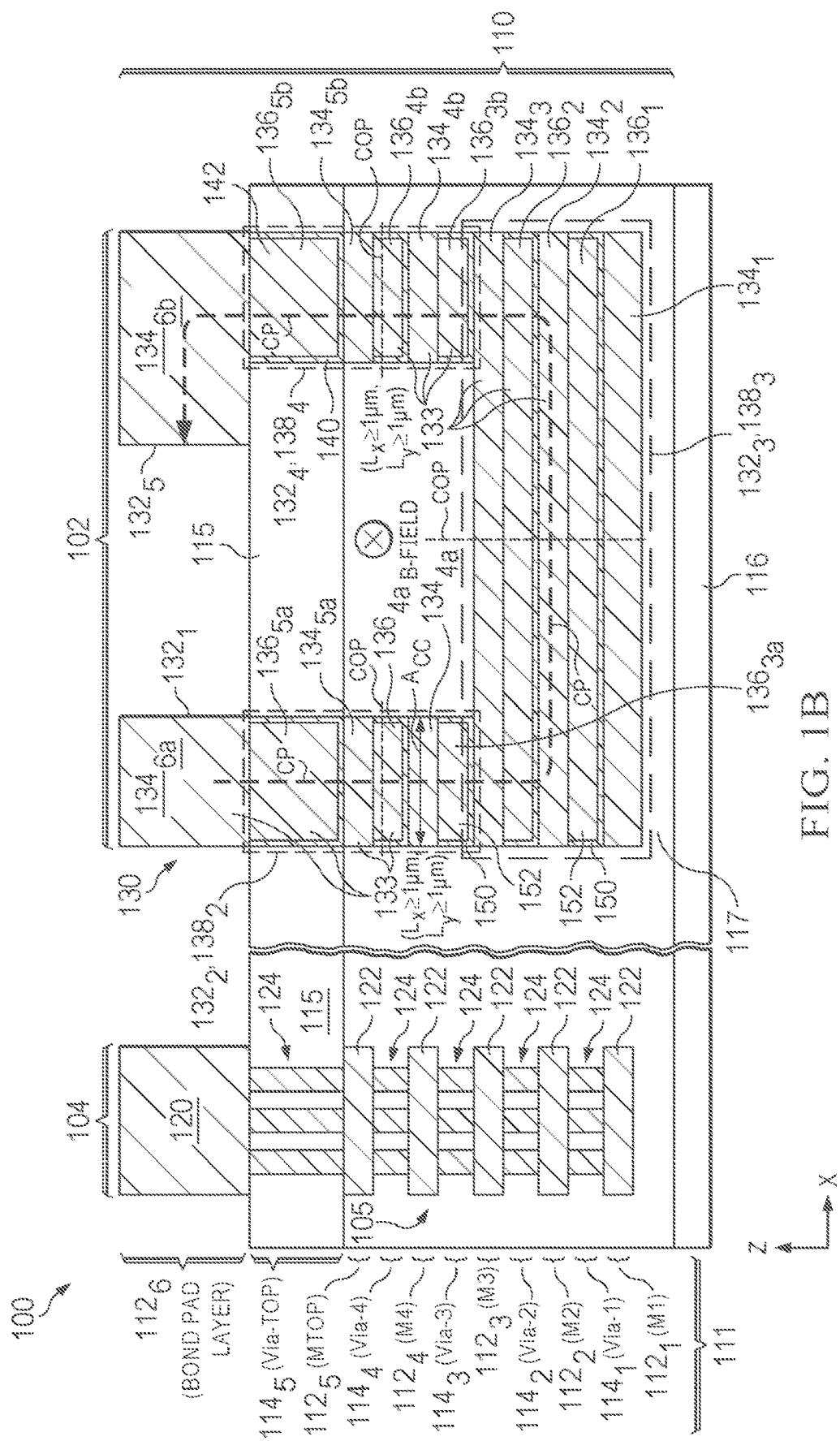

FIGS. 1A and 1B show an IC device 100 including an example integrated inductor 102 and an example metal interconnect structure 104. FIG. 1A shows a three-dimensional perspective view of IC device 100, generally from above, and FIG. 1B shows a side cross-sectional view of IC device 100 through plane $P_{2B}$ shown in FIG. 1A.

As shown in FIGS. 1A and 1B collectively, IC device 100 includes an IC layer stack 110 formed over a substrate 116, e.g., a silicon substrate, extending in an x-y plane (e.g., perpendicular to the z-direction). The IC layer stack 110 may be formed directly on the substrate 116, or IC device 100 may include any number of intervening layers or structures in a region 117 between the substrate 116 and the bottom of the IC layer stack 110.

The IC layer stack 110 includes a stack of IC layers 111 including multiple metal layers $112_1$-$112_6$ and multiple via layers $114_1$-$114_5$ formed in an alternating manner in a vertical direction (z-direction), with respective via layers 114 located between a respective pair of metal layers 112. Metal layers $112_1$-$112_6$ and via layers $114_1$-$114_5$ are also referred to simply as metal layers 112 and via layers 114, respectively, for convenience.

With reference to FIG. 1B, metal layers $112_1$-$112_5$ are metal interconnect layers (referred to as M1, M2, M3, M4, and MTOP, respectively) and metal layer $112_6$ is a bond pad layer, and via layers $114_1$-$114_5$ are interconnect via layers (referred to as Via-1, Via-2, Via-3, Via-4, and Via-top, respectively). Via layer $114_5$ (Via-top) may be formed in a passivation layer 115, and may be deeper (z-direction) than respective via layers $114_1$-$114_4$. Passivation layer 115 may include any suitable passivation material(s). In one example, passivation layer 115 comprises a two layer construction including (1) a planarized high density plasma (HDP) silicon oxide ($SiO_2$) layer, e.g., having a thickness of about 1 µm, and (2) a silicon oxy-nitride (SiON) layer, e.g., also having a thickness of about 1 µm.

In one example, each metal interconnect layer $112_1$-$112_5$ may have a z-direction depth of about 0.2-0.4 µm; each via layer $114_1$-$114_5$ may have a z-direction depth of about 0.6-0.9 µm; via layer $114_5$ (Via-top) may have a z-direction depth of about 2 µm; and bond pad layer metal layer $112_6$ may have a z-direction depth of about 2 µm. However, any of the IC layers 111 discussed above may have any other suitable z-direction depth. The term via layer, as used herein and throughout, refers to the metal elements formed in a respective dielectric region between vertically adjacent metal layers.

The number of metal layers 112 and via layers 114 shown in FIG. 1B are examples only. In other examples, IC layer stack 110 may include any other number of metal layers 112 and via layers 114. In addition, in some examples, IC layer stack 110 may be defined by a selected set of metal layers 112 and via layers 114 at any depth below the top of the IC device 100 (in the z-direction).

Still referring to FIG. 1B, the example metal interconnect structure 104 includes multiple interconnect elements 105 including (a) a bond pad 120 formed in bond pad layer $112_6$, (b) at least one metal layer interconnect element 122 formed in each metal interconnect layer $112_1$-$112_5$, and (c) at least one interconnect via 124 formed in each via layer $114_1$-$114_5$ and conductively connecting metal layer interconnect elements 122 of vertically adjacent metal interconnect layers $112_1$-$112_5$ (e.g., interconnect vias 124 formed in via layer $114_3$ conductively connect the respective metal layer interconnect elements 122 in vertically adjacent metal interconnect layers $112_3$ and $112_4$).

In the illustrated example, the cross-sectional plane $P_{2B}$ passes through the bond pad 120, the metal layer interconnect elements 122, and the interconnect vias 124 in each respective IC layer 111 of the IC layer stack 110. In other examples, the metal interconnect structure 104 may include multiple interconnect elements 105 formed at various lateral locations in the x-direction and/or y-direction (instead of being aligned in a common vertical plane as in the example of FIG. 1B).

The example integrated inductor 102 includes an inductor wire 130 having a spiral shape (as best shown in FIG. 1A) defining a magnetic B-field extending parallel to the substrate 116, which may reduce substrate loss as compared with integrated inductors having magnetic B-field extending orthogonal to the device substrate.

The inductor wire 130 includes multiple wire segments $132_1$-$132_n$ connected in series to form a spiral shape. At least some wire segments $132_1$-$132_n$ may be defined by an inductor element stack including multiple conductive inductor elements 133, including metal layer inductor elements 134 and multi-component via layer inductor elements ("MC via layer inductor elements") 136, formed in a group of multiple vertically-adjacent IC layers 111. In some examples, at least some wire segments $132_1$-$132_n$ include (a) a respective metal layer inductor element 134 formed in at least one respective metal layer 112 and (b) a respective MC via layer inductor element 136 formed in at least one respective via layer 114. In some examples, at least some wire segments $132_1$-$132_n$ include (a) respective metal layer inductor elements 134 formed in at least two respective metal layers 112 and (b) respective MC via layer inductor elements 136 formed in at least two respective via layers 114.

The cross-section view of FIG. 1B (through plane $P_{2B}$ shown in FIG. 1A) shows five wire segments $132_1$-$132_5$ of the inductor wire 130 of integrated inductor 102. As shown:
(a) an inductor terminal wire segment $132_1$ is defined by a metal layer inductor element $134_{6a}$ formed in bond pad layer $112_6$;
(b) a first vertically-extending wire segment $132_2$ wire segment is defined by an inductor element stack $138_2$ of conductively connected inductor elements 133 including (i) MC via layer inductor elements $136_{3a}$, $136_{4a}$, and $136_{5a}$ formed in via layers $114_3$, $114_3$, and $114_5$, respectively and (ii) metal layer inductor elements $134_{4a}$ and $134_{5a}$ formed in metal layer $112_4$, and $112_5$, respectively;
(c) a laterally-extending lower wire segment $132_3$ wire segment is defined by an inductor element stack $138_3$ of conductively connected inductor elements 133 including (i) metal layer inductor elements $134_1$, $134_2$, and $134_3$ formed in metal layer $112_1$, $112_2$, and $112_3$, respectively, and (ii) MC via layer inductor elements $136_1$ and $136_2$ formed in via layers $114_1$ and $114_2$, respectively;
(d) a second vertically-extending wire segment $132_4$ wire segment is defined by an inductor element stack $138_4$ including (i) MC via layer inductor elements $136_{3b}$, $136_{4b}$, and $136_{5b}$ formed in via layers $114_3$, $114_3$, and $114_5$, respectively and (ii) metal layer inductor elements $134_{4b}$ and $134_{5b}$ formed in metal layer $112_4$, and $112_5$, respectively; and
(e) a laterally-extending upper wire segment $132_5$ wire segment is defined by a metal layer inductor element $134_{6b}$ formed in bond pad layer $112_6$.

In some examples, the inductor wire 130 exhibits low resistance characteristics. For example, in some examples the inductor wire 130 has a sheet resistance of less than 10 mΩ/sq. In some examples, the inductor wire 130 has a sheet resistance of less than 3 mΩ/sq.

In some examples, the low resistance characteristics of the inductor wire 130 are defined at least by the wire thickness of the inductor wire 130. The wire thickness of an inductor wire (e.g., inductor wire 130) may be defined by specified dimensions of the inductor wire in a plane orthogonal to a current path along the inductor wire, referred to as a "current-orthogonal plane." FIG. 1B shows the current path CP through a portion of inductor wire 130. For example, the wire thickness of an inductor wire may be defined by (a) an area in the current-orthogonal plane and/or (b) a length in each of two orthogonal directions in the current-orthogonal plane.

In some examples, the inductor wire 130 has an area of at least 1 µm², at least 5 µm², at least 10 µm², or at least 100 µm² in the current-orthogonal plane along the full length of the inductor wire 130 (i.e., from wire segment $132_1$ to wire segment $132n$). In some examples, the inductor wire 130 has a length of at least 1 µm, at least 2 µm, at least 5 µm, at least 10 µm, or at least 100 µm in each of two orthogonal directions in the current-orthogonal plane, along the full length of the inductor wire 130 (i.e., from wire segment $132_1$ to wire segment $132n$).

For example, for each of the wire segments $132_2$ and $132_4$ (first and second vertically-extending wire segments), the current-orthogonal plane corresponds with the x-y plane. Each wire segment $132_2$ and $132_4$ may have (a) an area of at least 1 µm$^2$, at least 5 µm$^2$, at least 10 µm$^2$, or at least 100 µm$^2$ in the current-orthogonal plane (x-y plane) and/or (b) a length of at least 1 µm, at least 2 µm, at least 5 µm, at least 10 µm, or at least 100 µm in each of the x-direction and y-direction (i.e., two orthogonal directions in the current-orthogonal plane (x-y plane)), along the full elongated length of each respective wire segment $132_2$ and $132_4$.

As another example, for wire segment $132_3$ (laterally-extending lower wire segment), the current-orthogonal plane corresponds with the y-z plane. Wire segment $132_3$ may have (a) an area of at least 1 µm$^2$, at least 5 µm$^2$, at least 10 µm$^2$, or at least 100 µm$^2$ in the current-orthogonal plane (y-z plane) and/or (b) a length of at least 1 µm, at least 2 µm, at least 5 µm, at least 10 µm, or at least 100 µm in each of the y-direction and z-direction (i.e., two orthogonal directions in the current-orthogonal plane (y-z plane)), along the full elongated length of the wire segment $132_3$.

As another example, for wire segment $132_5$ (laterally-extending upper section), the current-orthogonal plane is orthogonal to the current path CP along wire segment $132_5$, indicated as COP in FIG. 1A. Wire segment $132_5$ may have (a) an area of at least 1 µm$^2$, at least 5 µm$^2$, at least 10 µm$^2$, or at least 100 µm$^2$ in the current-orthogonal plane COP and/or (b) a length of at least 1 µm, at least 2 µm, at least 5 µm, at least 10 µm, or at least 100 µm in each of two orthogonal directions in the current-orthogonal plane COP, along the full elongated length of the wire segment $132_5$.

With reference to FIG. 1B, in some examples each conductive inductor element 133, including each metal layer inductor element 134 and each MC via layer inductor element 136, has a length of at least 1 µm, at least 2 µm, at least 5 µm, at least 10 µm, or at least 100 µm in both the x-direction and y-direction, depending on the particular example.

In some examples, bond pad layer $112_6$ and underlying metal layers $112_1$-$112_5$ may be formed from aluminum, and via layers $114_1$-$114_5$ may include multiple components formed from different metals. In the example shown in FIG. 1B, each interconnect via 124 may be formed from a first metal (e.g., tungsten or other conformal metal), and each MC via layer inductor element 136 may include (a) a via layer inductor element cup-shaped component 150 formed from the first metal (e.g., tungsten or other conformal metal) and (b) a via layer inductor element fill component 152 formed from a second metal (e.g., aluminum or titanium nitride).

As discussed below with reference to FIGS. 5A-5G, each MC via layer inductor element 136 may be formed together with an interconnect via 124 (or multiple interconnect via 124) by a dual-metal deposition process:
(a) depositing the first metal (e.g., tungsten or other conformal metal) to form (i) the interconnect via 124 in an interconnect via opening and (ii) the via layer inductor element cup-shaped component 150 in an inductor element tub opening, and
(b) depositing the second metal (e.g., aluminum or titanium nitride) over the first metal and extending into an opening defined by the via layer inductor element cup-shaped component 150, to define the via layer inductor element fill component 152.

In a typical IC device, tungsten is suitable for forming interconnect via, e.g., formed as vertically-elongated structures with a length of less than 0.5 µm in at least one lateral direction (e.g., x-direction and/or y-direction), but may be unsuitable for filling larger openings, e.g., wide openings with a length of at least 1 µm, at least 2 µm, at least 5 µm, at least 10 µm, or at least 100 µm in both lateral directions (e.g., x-direction and y-direction). For example, tungsten fills in a conformal manner, which creates high tensile stresses in larger fill structures (e.g., MC via layer inductor elements 136), potentially resulting in tungsten peeling or breakage of the wafer on which the IC device 100 is formed. Thus, the dual-metal deposition process described above (and discussed in more detail below with reference to FIGS. 5A-6G) may be used to concurrently form interconnect vias 124 and MC via layer inductor element 136 while avoiding potential problems associated with using tungsten or other conformal metal to form larger openings (e.g., inductor element tub openings).

In some examples, aluminum (or titanium nitride) may be used as the second metal for forming the via layer inductor element fill component 152. As discussed above, aluminum may provide various advantages as the fill metal, for example to provide costs savings relative to using copper as the fill metal. However, in other examples, copper or other metal may be used as the second metal for forming the via layer inductor element fill component 152.

In some examples, each inductor element tub opening (and accordingly the MC via layer inductor element 136 formed therein) has a length of at least 1 µm, at least 2 µm, at least 5 µm, at least 10 µm, or at least 100 µm in both the x-direction and y-direction, while each interconnect via opening (and accordingly the interconnect via 124 formed therein) has a length of less than 0.5 µm in both the x-direction and y-direction.

In some examples, each pair of vertically-adjacent inductor elements 133 of the inductor wire 130 have an area of conductive contact ($A_{CC}$) with each other of at least 1 µm$^2$, at least 5 µm$^2$, at least 10 µm$^2$, or at least 100 µm$^2$ and/or or a length of at least 1 µm, at least 2 µm, at least 5 µm, at least 10 µm, or at least 100 µm in each of two orthogonal directions in a plane of the contact area. For example, as shown in FIGS. 1A-1B collectively, an area of conductive contact Acc between metal inductor element $134_{4a}$ and MC via layer inductor element $136_{4a}$ may have an area of at least 1 µm$^2$, at least 5 µm$^2$, at least 10 µm$^2$, or at least 100 µm$^2$ and/or or a length of at least 1 µm, at least 2 µm, at least 5 µm, at least 10 µm, or at least 100 µm in both the x-direction and y-direction.

Figure 2A:
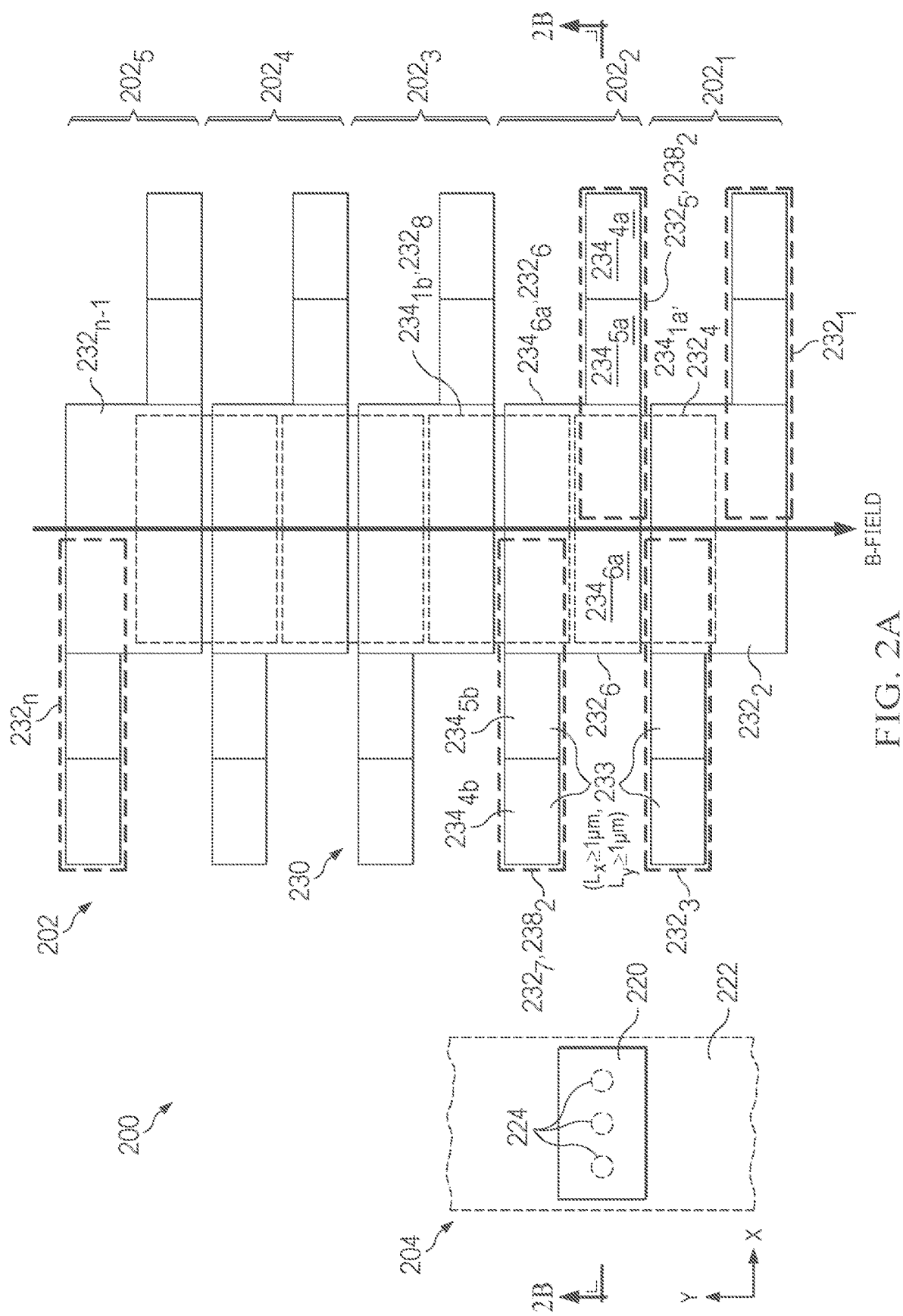
FIGS. 2A and 2B show an IC device including another example integrated inductor and an example metal interconnect structure.
Figure 2B:
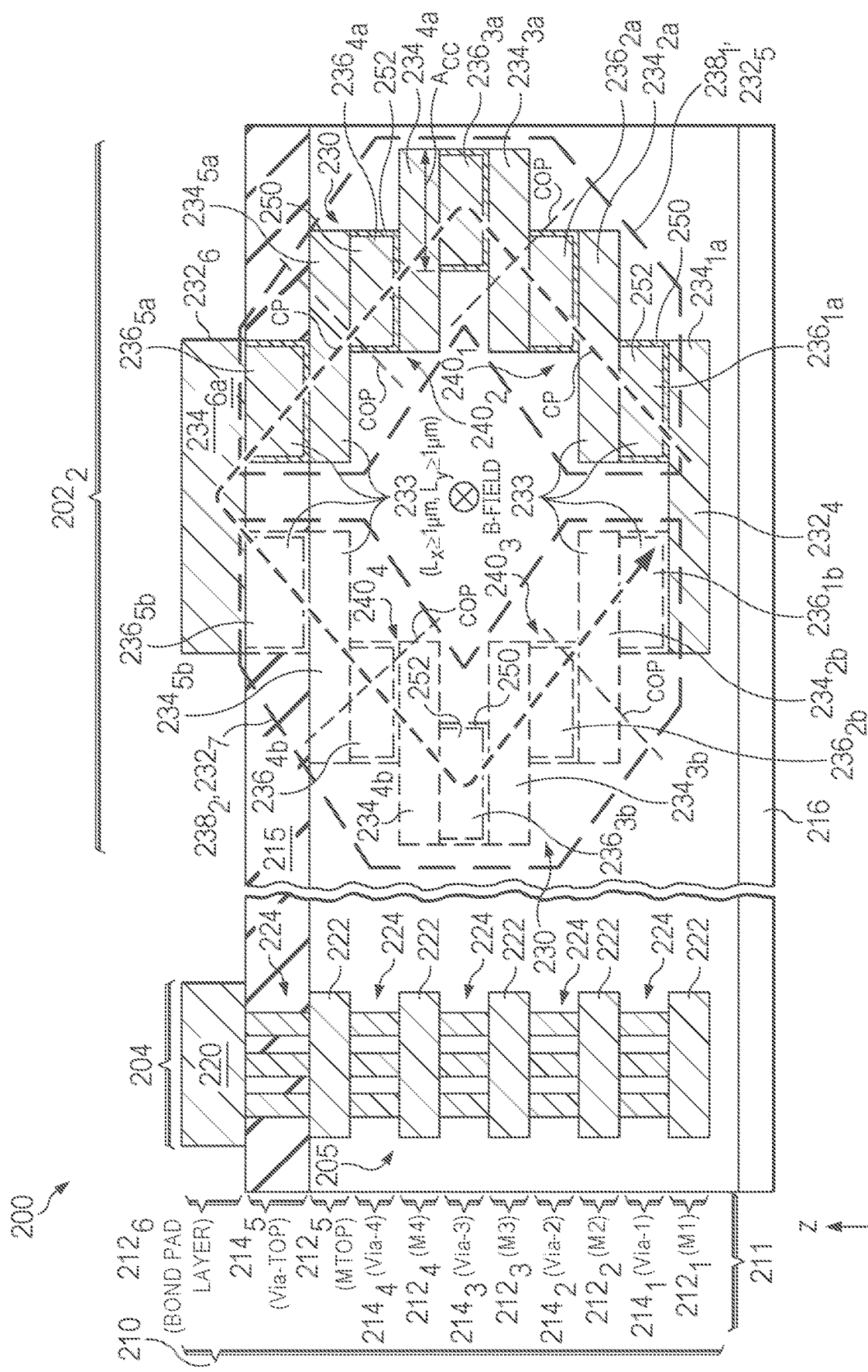

FIGS. 2A and 2B show an IC device 200 including another example integrated inductor 202 and an example metal interconnect structure 204. FIG. 2A shows a top view of IC device 200, and FIG. 2B shows a side cross-sectional view of IC device 200 through cut line 2B-2B shown in FIG. 2A.

With reference to FIG. 2A, integrated inductor 202 is a spiral inductor including an inductor wire 230 having five inductor wire coils $202_1$-$202_5$ and generating a magnetic B-field extending parallel to the substrate 216, which may reduce substrate loss as compared with integrated inductors having magnetic B-field extending orthogonal to the device substrate.

With reference to FIGS. 2A and 2B, inductor wire 230 may include multiple wire segments $232_1$-$232_n$ connected in series to form a spiral shape. At least some wire segments $232_1$-$232_n$ may be defined by an inductor element stack including multiple conductive inductor elements 233, including metal layer inductor elements 234 and MC via layer inductor elements 236, formed in a group of multiple vertically-adjacent IC layers 211. In some examples, at least some wire segments $232_1$-$232_n$ include (a) a respective metal layer inductor element 234 formed in at least one respective metal layer 212 and (b) a respective MC via layer inductor element 236 formed in at least one respective via layer 214. As discussed below in more detail, in the illustrated example, wire segments $232_1$-$232_n$ of inductor wire 230 include each of the following:

(a) laterally-extending upper wire segments (e.g., wire segments $232_2$, $232_6$, and $232_n$) formed in a respective metal layer 212, for example wire segment $232_6$ defined by a metal layer inductor element $234_{6a}$ formed in a bond pad layer $212_6$, as shown in FIG. 2B;

(b) laterally-extending lower wire segments (e.g., wire segments $232_4$ and $232_8$) formed in a respective metal layer 212, for example wire segment $232_4$ defined by a metal layer inductor element $234_{1a}$ formed in a lower metal layer $212_1$, as shown in FIG. 2B; and (c) vertically-extending wire segments (e.g., wire segments $232_1$, $232_3$, $232_5$, $232_7$, and $232_n$) conductively connecting selected laterally-extending upper wire segments with selected laterally-extending lower wire segments. For example, vertically-extending wire segment $232_3$ connects laterally-extending upper wire segment $232_2$ with laterally-extending lower wire segment $232_4$; vertically-extending wire segment $232_5$ connects laterally-extending lower wire segment $232_4$ with laterally-extending upper wire segment $232_6$; and vertically-extending wire segment $232_7$ connects laterally-extending upper wire segment $232_6$ with laterally-extending lower wire segment $232_8$. As shown in FIG. 2B, each vertically-extending wire segment (e.g., wire segments $232_1$, $232_3$, $232_5$, $232_7$, and $232_n$) may be defined by a respective inductor element stack 238 of conductively connected inductor elements 233 including at least one MC via layer inductor elements 236 formed in at least one respective via layer 114 and at least one metal layer inductor element 234 formed in at least one respective metal layer 112.

The cross-sectional view of FIG. 2B shows a selected inductor wire coil $202_2$ along with the example metal interconnect structure 204. As shown in FIG. 2B, IC device 200 includes an IC layer stack 210 formed over a substrate 216, e.g., a silicon substrate, extending in an x-y plane (e.g., perpendicular to the z-direction). The IC layer stack 210 may be formed directly on the substrate 216, or IC device 200 may include any number of intervening layers or structures (not shown) between the substrate 216 and the bottom of the IC layer stack 210.

The IC layer stack 210 includes a stack of IC layers 211 including multiple metal layers $212_1$-$212_6$ and multiple via layers $214_1$-$214_5$ formed in an alternating manner in a vertical direction (z-direction), with respective via layers 214 located between a respective pair of metal layers 212. Metal layers $212_1$-$212_6$ and via layers $214_1$-$214_5$ are also referred to as metal layers 212 and via layers 214, respectively, for convenience.

In this example, metal layers $212_1$-$212_5$ are metal interconnect layers (referred to as M1, M2, M3, M4, M5, and MTOP, respectively) and metal layer $212_6$ is a bond pad layer, and via layers $214_1$-$214_5$ are interconnect via layers. Via layer $214_5$ (Via-top layer) may be formed in a passivation layer 215.

The number of metal layers 212 and via layers 214 shown in FIG. 2B are examples only. In other examples, IC layer stack 210 may include any other number of metal layers 212 and via layers 214. In addition, in some examples, IC layer stack 210 may be defined by a selected set of metal layers 212 and via layers 214 at any depth below the top of the IC device 200 (in the z-direction).

Still referring to FIG. 2B, the example metal interconnect structure 204 includes multiple interconnect elements 205 including (a) a bond pad 220 formed in bond pad layer $212_6$, (b) at least one metal layer interconnect element 222 formed in each metal interconnect layer $212_1$-$212_5$, and (c) at least one interconnect via 224 formed in each via layer $214_1$-$214_5$ and conductively connecting metal layer interconnect elements 222 of vertically adjacent metal interconnect layers $212_1$-$212_5$ (e.g., interconnect vias 224 formed in via layer $214_4$ conductively connects the respective metal layer interconnect elements 222 in vertically adjacent metal interconnect layers $212_4$ and $212_5$).

In the illustrated example, the cross-sectional cut line 2B-2B (shown in FIG. 2A) cuts through the bond pad 220, the metal layer interconnect elements 222, and the interconnect vias 224 in each IC layer 211 of the IC layer stack 210. In other examples, the metal interconnect structure 204 may include multiple interconnect elements 205 formed at various lateral locations in the x-direction and/or y-direction (instead of being aligned in a common vertical plane as in the example of FIG. 2B).

As shown in FIG. 2B, inductor wire coil $202_2$ includes (a) a first inductor element stack $238_1$ defining vertically-extending wire segment $232_5$ and (b) a second inductor element stack $238_2$ defining vertically-extending wire segment $232_7$ and offset from the first inductor element stack $238_1$ in the y-direction. As shown, first inductor element stack $238_1$ (defining vertically-extending wire segment $232_5$) is connected between metal layer inductor element $234_{1a}$ (defining laterally-extending lower wire segment $232_4$) formed in metal layer $212_1$ and metal layer inductor element $234_{6a}$ (defining laterally-extending upper wire segment $232_6$) formed in bond pad layer $212_6$. Similarly, second inductor element stack $238_2$ (defining vertically-extending wire segment $232_7$) is connected between metal layer inductor element $234_{6a}$ (defining laterally-extending upper wire segment $232_6$) formed in bond pad layer $212_6$ and a metal layer inductor element $234_{1b}$ (visible in FIG. 2A) formed in metal layer $212_1$ (wherein metal layer inductor element $234_{1b}$ defines a laterally-extending lower wire segment $232_8$).

Each of the first inductor element stack $238_1$ (vertically-extending wire segment $232_5$) and second inductor element stack $238_2$ (vertically-extending wire segment $232_7$) includes a stack of conductively-connected inductor elements 233, including metal layer inductor elements 234 and MC via layer inductor elements 236, formed in a group of multiple vertically-adjacent IC layers 211.

In the illustrated example, the first inductor element stack $238_1$ includes conductively connected inductor elements 233 including metal layer inductor elements $234_{2a}$-$234_{5a}$ formed respectively in metal layers $212_2$-$212_5$ and MC via layer inductor elements $236_{1a}$-$236_{5a}$ formed respectively in via layers $214_1$-$214_5$. As shown, the conductively connected inductor elements 233 in the first inductor element stack $238_1$ (including metal layer inductor elements $234_{2a}$-$234_{5a}$ and MC via layer inductor elements $236_{1a}$-$236_{5a}$) form a stair-stepped structure defining two diagonally-extending wire segments 240₁ and 240₂, each extending both vertically and laterally (i.e., diagonally) with respect to the vertical z-direction. In the illustrated example, each metal layer inductor element 234 in each diagonally-extending wire segment 240₁ and 240₂ laterally overhangs the immediately underlying MC via layer inductor element 236 in at least the x-direction.

Similarly, the second inductor element stack 238₂ includes conductively connected inductor elements 233 including metal layer inductor elements 234₂ᵦ-234₅ᵦ formed respectively in metal layer 212₂-212₅ and MC via layer inductor elements 236₁ᵦ-236₅ᵦ formed respectively in via layers 214₁-214₅. As shown, the conductively connected inductor elements 233 in the second inductor element stack 238₂ (including metal layer inductor elements 234₂ᵦ-234₅ᵦ and MC via layer inductor elements 236₁ᵦ-236₅ᵦ) form a stair-stepped structure defining two diagonally-extending wire segments 240₃ and 240₄, each extending diagonally with respect to the z-direction (vertical). In the illustrated example, each metal layer inductor element 234 in each diagonally-extending wire segment 240₃ and 240₄ laterally overhangs the immediately underlying MC via layer inductor element 236 in at least the x-direction.

As used herein, a metal layer inductor element 234 "laterally overhangs" an underlying MC via layer inductor element 236 in a respective lateral direction (e.g., x-direction) if the metal layer inductor element 234 extends laterally beyond a perimeter of the via layer inductor element 234 by a defined distance. In some example, at least some metal layer inductor elements 234 in the first inductor element stack 238₁ and/or second inductor element stack 238₂ laterally overhang their respective underlying MC via layer inductor elements 236 by at least 1 µm, at least 2 µm, at least 5 µm, at least 10 µm, or at least 100 µm in a respective lateral direction (e.g., x-direction). In some example, at least some metal layer inductor elements 234 in the first inductor element stack 238₁ and/or second inductor element stack 238₂ laterally overhang their respective underlying MC via layer inductor elements 236 in a respective lateral direction (e.g., x-direction) by at least 10%, at least 20%, at least 30%, or at least 50% of a length of the respective underlying MC via layer inductor element 236 in the respective lateral direction.

As shown in FIG. 2B, each MC via layer inductor element 236 in inductor wire 230 may include (a) a via layer inductor element cup-shaped component 250 formed from a first metal (e.g., tungsten or other conformal metal) and (b) a via layer inductor element fill component 252 formed from a second metal (e.g., aluminum or titanium nitride).

In some examples, bond pad layer 212₆ and underlying metal layers 212₁-212₅ may be formed from aluminum or titanium nitride, and via layers 214₁-214₅ may include multiple components formed from different metals. In the example shown in FIG. 2B, each interconnect via 224 may be formed from a first metal (e.g., tungsten or other conformal metal), and each MC via layer inductor element 236 may include (a) a via layer inductor element cup-shaped component 250 formed from the first metal (e.g., tungsten or other conformal metal) and (b) a via layer inductor element fill component 252 formed from a second metal (e.g., aluminum or titanium nitride).

As discussed below with reference to FIGS. 6A-6G, each MC via layer inductor element 236 may be formed together with an interconnect via 224 (or multiple interconnect via 224) by a dual-metal deposition process:
(a) depositing the first metal (e.g., tungsten or other conformal metal) to form (i) the interconnect via 224 in an interconnect via opening and (ii) the via layer inductor element cup-shaped component 250 in an inductor element tub opening, and
(b) depositing the second metal (e.g., aluminum or titanium nitride) over the first metal and extending into an opening defined by the via layer inductor element cup-shaped component 250, to define the via layer inductor element fill component 252.

In some examples, aluminum (or titanium nitride) may be used as the second metal for forming the via layer inductor element fill component 252. As discussed above, aluminum may provide various advantages as the fill metal, for example to provide costs savings relative to using copper as the fill metal. However, in other examples, copper or other metal may be used as the second metal for forming the via layer inductor element fill component 252.

In some examples, the inductor wire 230 exhibits low resistance characteristics. For example, in some examples the inductor wire 230 has a sheet resistance of less than 10 mΩ/sq. In some examples, the inductor wire 230 has a sheet resistance of less than 3 mΩ/sq.

In some examples, the low resistance characteristics of the inductor wire 230 are defined at least by the wire thickness of the inductor wire 230. As discussed above regarding inductor wire 130, the wire thickness of inductor wire 230 may be defined by specified dimensions of the inductor wire in the current-orthogonal plane COP, e.g., (a) an area in the current-orthogonal plane and/or (b) a length in each of two orthogonal directions in the current-orthogonal plane.

In some examples, the inductor wire 230 has an area of at least 1 µm², at least 5 µm², at least 10 µm², or at least 100 µm² (depending on the particular example) in the current-orthogonal plane COP along the full length of the inductor wire 230 (i.e., along coils 202₁-202₅). In some examples, the inductor wire 230 has a length of at least 1 µm, at least 2 µm, at least 5 µm, at least 10 µm, or at least 100 µm in each of two orthogonal directions in the current-orthogonal plane COP, along the full length of the inductor wire 230.

In some examples, each pair of vertically-adjacent inductor elements 233 of the inductor wire 230 has an area of conductive contact ($A_{CC}$) with each other of at least 1 µm², at least 5 µm², at least 10 µm², or at least 100 µm² and/or or a length of at least 1 µm, at least 2 µm, at least 5 µm, at least 10 µm, or at least 100 µm in each of two orthogonal directions in a plane of the contact area. For example, as shown in FIG. 2B, an area of conductive contact $A_{CC}$ between MC via layer inductor element 236₃ₐ and adjacent metal inductor element 234₄ₐ may have an area of at least 1 µm² and/or or a length of at least 1 µm, at least 2 µm, at least 5 µm, at least 10 µm, or at least 100 µm in both the x-direction and y-direction.

With reference to FIG. 2B, in some examples each conductive inductor element 233, including each metal layer inductor element 234 and each MC via layer inductor element 236, has a length of at least 1 µm, at least 2 µm, at least 5 µm, at least 10 µm, or at least 100 µm in both the x-direction and y-direction, depending on the particular example. As discussed below with reference to FIGS. 5A-6G, MC via layer inductor elements 236 may be formed concurrently with respective interconnect vias 224, wherein each MC via layer inductor element 236 has a length of at least 1 µm, at least 2 µm, at least 5 µm, at least 10 µm, or at least 100 µm in both the x-direction and y-direction, while each interconnect via 224 has a length of less than 0.5 µm in both the x-direction and y-direction.

Figure 3A:
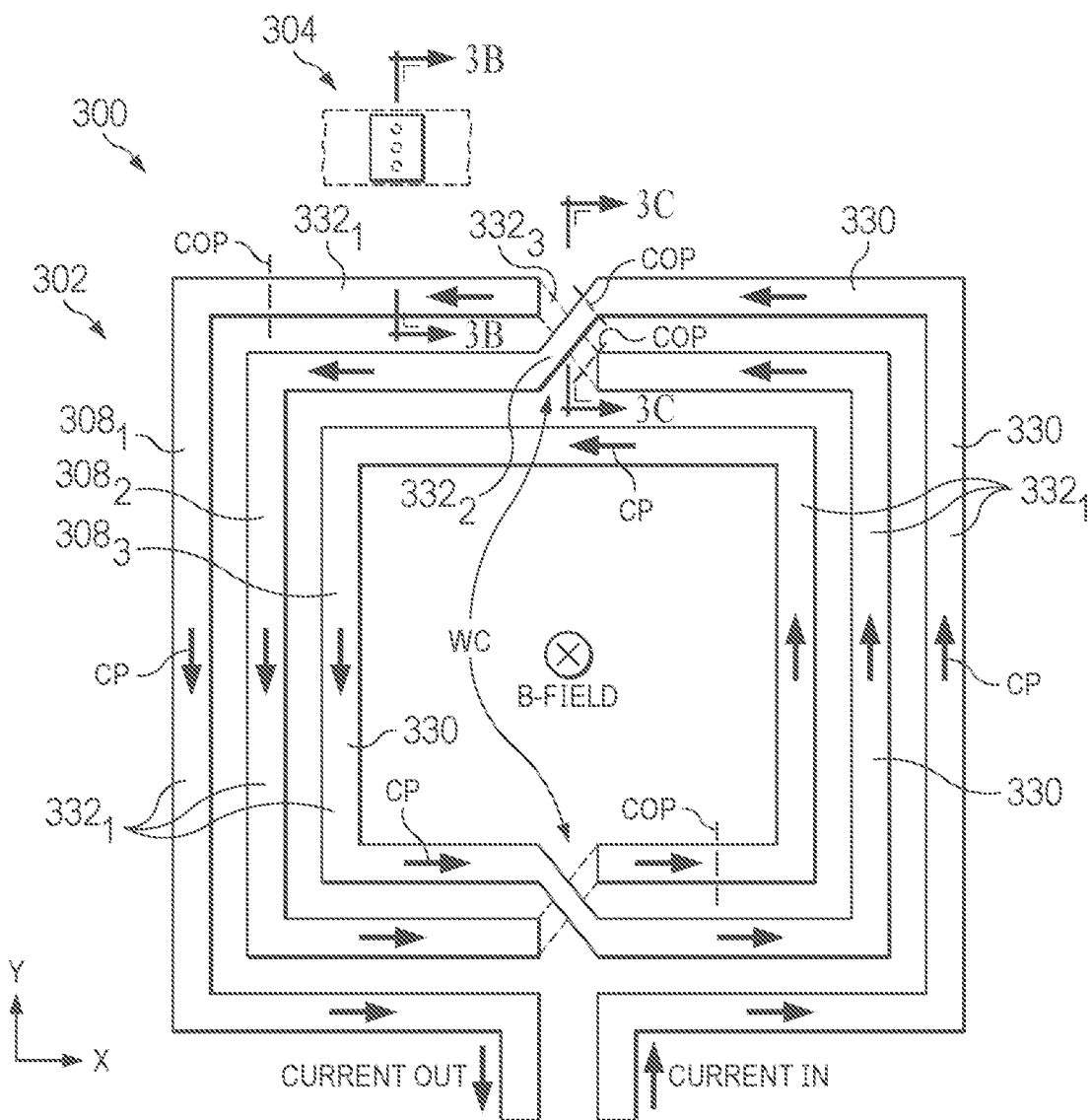
FIGS. 3A-3C show an IC device including an example spiral integrated inductor and an example metal interconnect structure.
Figure 3B:
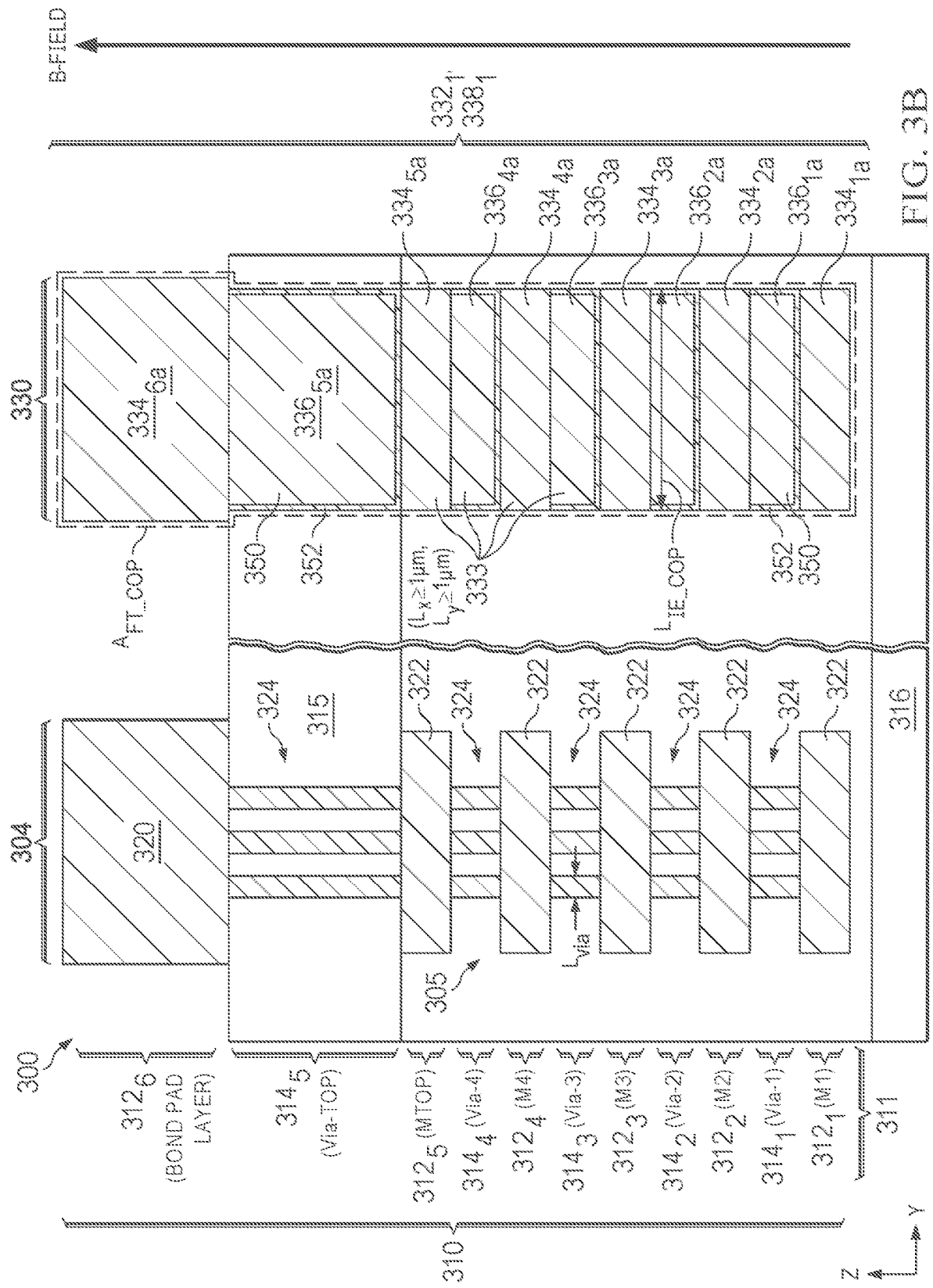
Figure 3C:
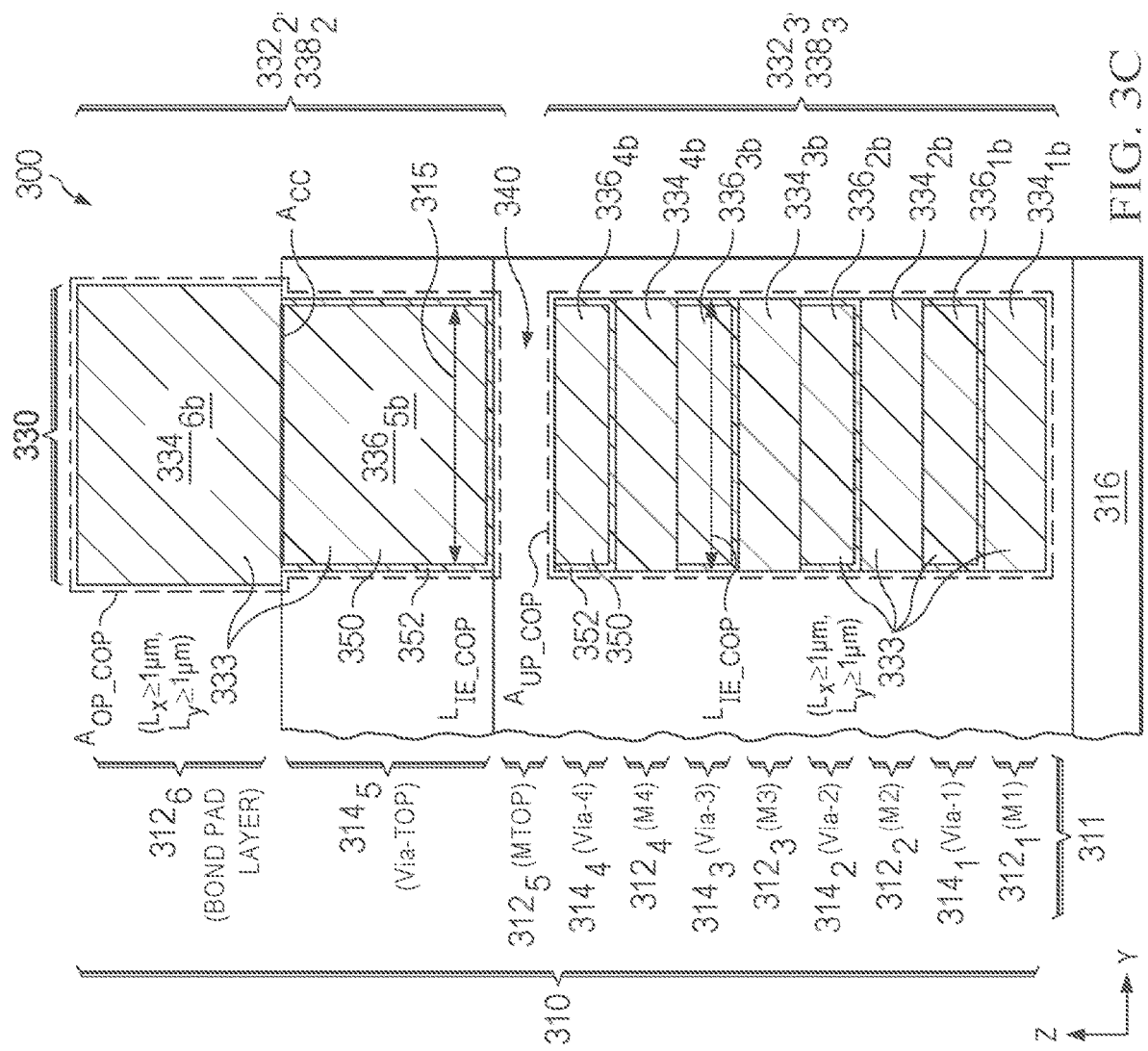

FIGS. 3A-3C show an IC device 300 including another example integrated inductor 302 having a spiral inductor wire 330, and an example metal interconnect structure 304. FIG. 3A shows a top view of IC device 300, showing the spiral inductor wire 330 of the integrated inductor 302, along with the example metal interconnect structure 304. As shown, the spiral inductor wire 330 includes three coils $308_1$-$308_3$ defining a spiral shape in the x-y plane, and a wire depth in the z-direction (which wire thickness is more clearly shown in FIGS. 3B and 3C, discussed below). The spiral inductor wire 330 crosses over itself at two locations referred to as wire crossover ("WC") locations. The spiral inductor wire 330 has a split-wire construction at each wire crossover location, and a full-thickness construction outside the wire crossover locations.

FIG. 3B shows a side cross-sectional view through cut line 3B-3B shown in FIG. 3A, showing the full-thickness (full-depth in the z-direction) construction of the spiral inductor wire 330 at a first location, along with the metal interconnect structure 304. FIG. 3C shows a side cross-sectional view through cut line 3C-3C shown in FIG. 3A, showing the split-wire structure of the spiral inductor wire 330 at a WC location. As shown in FIGS. 3A-3C, the orientation of the spiral inductor wire 330 of integrated inductor 302 generates a magnetic B-field extending perpendicular to an underlying substrate 316.

As shown in FIG. 3B, IC device 300 includes an IC layer stack 310 formed over substrate 316, e.g., a silicon substrate, extending in the x-y plane. The IC layer stack 310 may be formed directly on the substrate 316, or IC device 300 may include any number of intervening layers or structures (not shown) between the substrate 316 and the bottom of the IC layer stack 310.

The IC layer stack 310 includes a stack of IC layers 311 including multiple metal layers $312_1$-$312_6$ and multiple via layers $314_1$-$314_5$ formed in an alternating manner in a vertical direction (z-direction), with each via layer 314 located between a respective pair of metal layers 312. Metal layers $312_1$-$312_6$ and via layers $314_1$-$314_5$ are also referred to as metal layers 312 and via layers 314, respectively, for convenience.

In this example, metal layers $312_1$-$312_5$ are metal interconnect layers (referred to as M1, M2, M3, M4, M5, and MTOP, respectively) and metal layer $312_6$ is a bond pad layer, and via layers $314_1$-$314_6$ are interconnect via layers. Via layer $314_5$ (Via-top layer) may be formed in a passivation layer 315.

The number of metal layers 312 and via layers 314 shown in FIG. 3B are examples only. In other examples, IC layer stack 310 may include any other number of metal layers 312 and via layers 314. In addition, in some examples, IC layer stack 310 may be defined by a selected set of metal layers 312 and via layers 314 at any depth below the top of the IC device 300 (in the z-direction).

Still referring to FIG. 3B, the example metal interconnect structure 304 includes multiple interconnect elements 305 including (a) a bond pad 320 formed in bond pad layer $312_6$, (b) at least one metal layer interconnect element 322 formed in each metal interconnect layer $312_1$-$312_5$, and (c) at least one interconnect via 324 formed in each via layer $314_1$-$314_5$ and conductively connecting metal layer interconnect elements 322 of vertically adjacent metal interconnect layers $312_1$-$312_5$ (e.g., interconnect vias 324 formed in via layer $314_3$ conductively connects the respective metal layer interconnect elements 322 in vertically adjacent metal interconnect layers $312_3$ and $312_4$).

As mentioned above, at locations other than the WC locations, which non-crossover locations referred to as full-thickness coil wire segments $332_1$, a thickness of the inductor wire 330 in the z-direction is defined by a first inductor element stack $338_1$ formed in the IC layer stack 310, as shown in FIG. 3B. The first inductor element stack $338_1$ includes a stack of conductively-connected inductor elements 333, including metal layer inductor elements $334_{1a}$-$334_{6a}$ formed respectively in metal layers $312_1$-$312_6$ and MC via layer inductor elements $336_{1a}$-$336_{5a}$ formed respectively in via layers $314_1$-$314_5$.

As mentioned above, FIG. 3C shows a cross-sectional view of the split-wire structure of the inductor wire 330 at a WC location (shown in FIG. 3A). The split-wire structure of inductor wire 330 includes (a) a WC overpass wire segment $332_2$ defined by a second inductor element stack $338_2$ and a WC underpass wire segment $332_3$ defined by a third inductor element stack $338_3$, wherein each of the second inductor element stack $338_2$ and third inductor element stack $338_3$ includes a stack of conductively-connected inductor elements 333 formed in selected IC layers 311 of the IC layer stack 310. In particular, second inductor element stack $338_2$ includes MC via layer inductor element $336_{5b}$ formed Via-top layer $314_5$ and metal layer inductor element $334_{6b}$ formed in bond pad layer $312_6$, and third inductor element stack $338_3$ includes metal layer inductor elements $334_{1b}$-$334_{4b}$ formed respectively in metal layers $312_1$-$312_4$ and MC via layer inductor elements $336_{1b}$-$336_{4b}$ formed respectively in via layers $314_1$-$314_4$. The second inductor element stack $338_2$ and third inductor element stack $338_3$ are physically separated and conductively insulated from each other by dielectric material 340 (in metal layer $312_5$) between MC via layer inductor element $336_{5b}$ of the second inductor element stack $338_2$ and MC via layer inductor element $336_{4b}$ of the third inductor element stack $338_3$.

In other examples, the thickness (in the z-direction) of each of the first inductor element stack $338_1$ and third inductor element stack $338_3$ may span any other number of IC layers 311 in the IC layer stack 310. Further, the second and third inductor element stacks $338_2$ and $338_3$ may be physically separated (and conductively insulated) from each other by multiple IC layers 311, e.g., to provide additional electrical insulation between the WC overpass wire segment $332_2$ and WC underpass wire segment $332_3$.

In some examples, bond pad layer $312_6$ and underlying metal layers $312_1$-$312_5$ may be formed from aluminum, and via layers $314_1$-$314_5$ may include multiple components formed from different metals. In the example shown in FIGS. 3B and 3C, each interconnect via 324 may be formed from a first metal (e.g., tungsten or other conformal metal), and each MC via layer inductor element 336 may include (a) a via layer inductor element cup-shaped component 350 formed from the first metal (e.g., tungsten or other conformal metal) and (b) a via layer inductor element fill component 352 formed from a second metal (e.g., aluminum or titanium nitride).

As discussed below with reference to FIGS. 5A-5G, each MC via layer inductor element 336 may be formed together with an interconnect via 324 (or multiple interconnect via 324) by a dual-metal deposition process:

(a) depositing the first metal (e.g., tungsten or other conformal metal) to form (i) the interconnect via 324 in an interconnect via opening and (ii) the via layer inductor element cup-shaped component 350 in an inductor element tub opening, and (b) depositing the second metal (e.g., aluminum or titanium nitride) over the first metal and extending into an opening defined by the via layer inductor element cup-shaped component 350, to define the via layer inductor element fill component 352.

In some examples, aluminum (or titanium nitride) may be used as the second metal for forming the via layer inductor element fill component 352. As discussed above, aluminum may provide various advantages as the fill metal, for example to provide costs savings relative to using copper as the fill metal. However, in other examples, copper or other metal may be used as the second metal for forming the via layer inductor element fill component 352.

In some examples, the inductor wire 330 exhibits low resistance characteristics. For example, in some examples the inductor wire 330 has a sheet resistance of less than 10 mΩ/sq. In some examples, the inductor wire 330 has a sheet resistance of less than 3 mΩ/sq.

In some examples, the low resistance characteristics of the inductor wire 330 are defined at least by the wire thickness of the inductor wire 330. As discussed above regarding inductor wires 130 and 230, the wire thickness of inductor wire 330 may be defined by specified dimensions of the inductor wire in the current-orthogonal plane COP.

With reference to FIGS. 3B and 3C, in some examples each inductor element 333 (including each metal layer inductor element 334 and each MC via layer inductor element 336) has a length $L_{IE\_COP}$ in the current-orthogonal plane COP (the length being orthogonal to the z-direction) of at least 1 μm, at least 2 μm, at least 5 μm, at least 10 μm, or at least 100 μm along the full length of the inductor wire 330, e.g., along coils $308_1$-$408_3$ and across each wire crossover location WC. Thus, with reference to FIG. 3B, each inductor element 333 in each full-thickness coil wire segment $332_1$, each WC overpass wire segment $332_2$, and each WC underpass wire segment $332_3$ has a respective length $L_{IE\_COP}$ of at least 1 μm, at least 2 μm, at least 5 μm, at least 10 μm, or at least 100 μm, depending on the particular example. In some examples, each inductor element 333 (including each metal layer inductor element 334 and each MC via layer inductor element 336) in each full-thickness coil wire segment $332_1$, each WC overpass wire segment $332_2$, and each WC underpass wire segment $332_3$ has a length $L_{IE\_COP}$ of at least 2 μm, at least 5 μm, at least 10 μm, or at least 100 μm (depending on the particular example), while each interconnect via 324 has a corresponding a length $L_{via}$ of less than 0.5 μm in the respective COP.

In some examples, the inductor wire 330 has an area of at least 1 μm², at least 5 μm², at least 10 μm², or at least 100 μm² (depending on the particular example) in the current-orthogonal plane COP, referred to as the COP area, along the full length of the inductor wire 330, e.g., along coils $308_1$-$308_3$ and across each WC location. Thus, referring to FIGS. 3B and 3C, each of (a) the COP area $A_{FT\_COP}$ of each full-thickness coil wire segment $332_1$, (b) the COP area $A_{OP\_COP}$ of each WC overpass wire segment $332_2$, and (c) the COP area $A_{UP\_COP}$ of each WC underpass wire segment $332_3$, is at least 1 μm², at least 5 μm², at least 10 μm², or at least 100 μm², depending on the particular example.

Figure 4A:
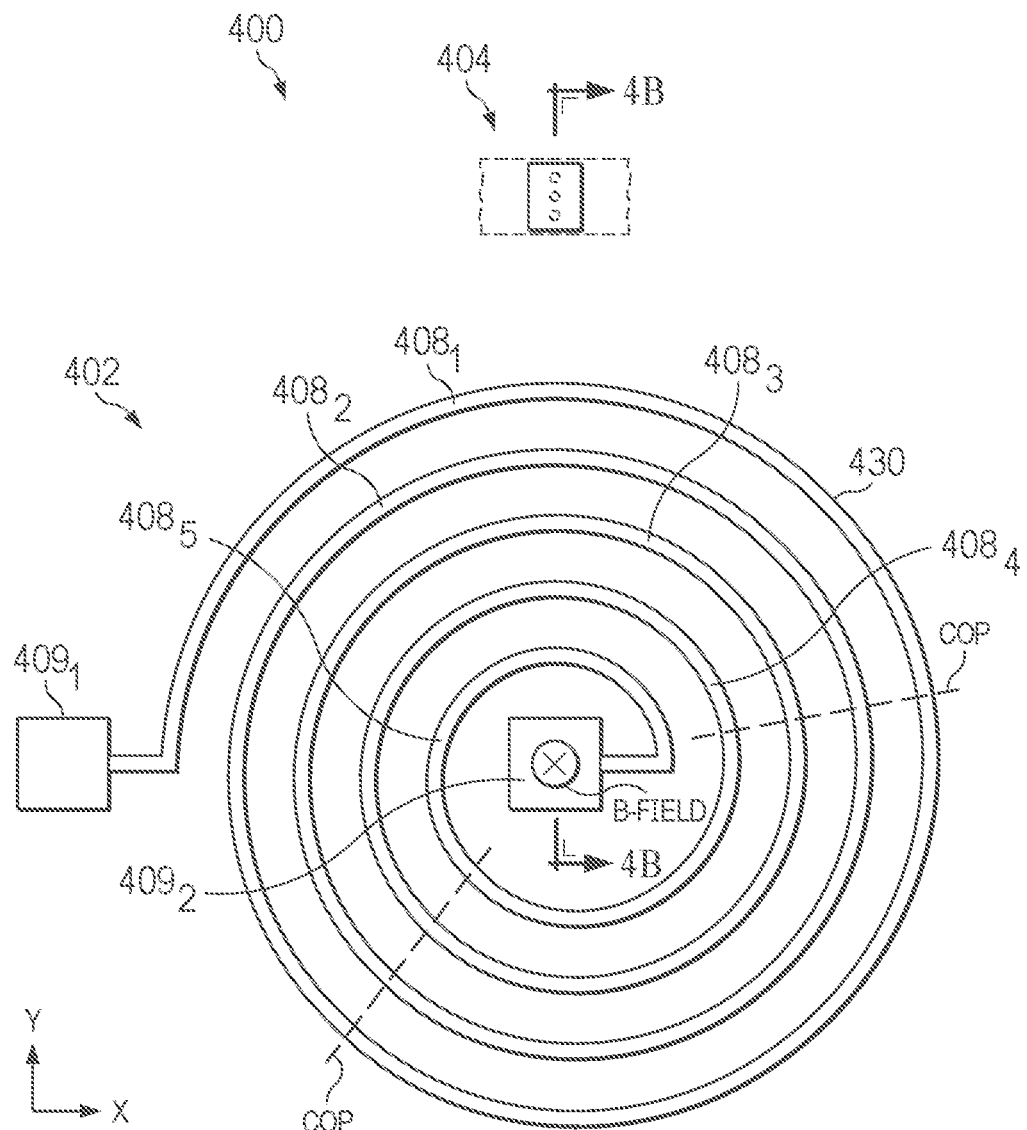
FIGS. 4A and 4B show an IC device including another example spiral integrated inductor and an example metal interconnect structure.
Figure 4B:
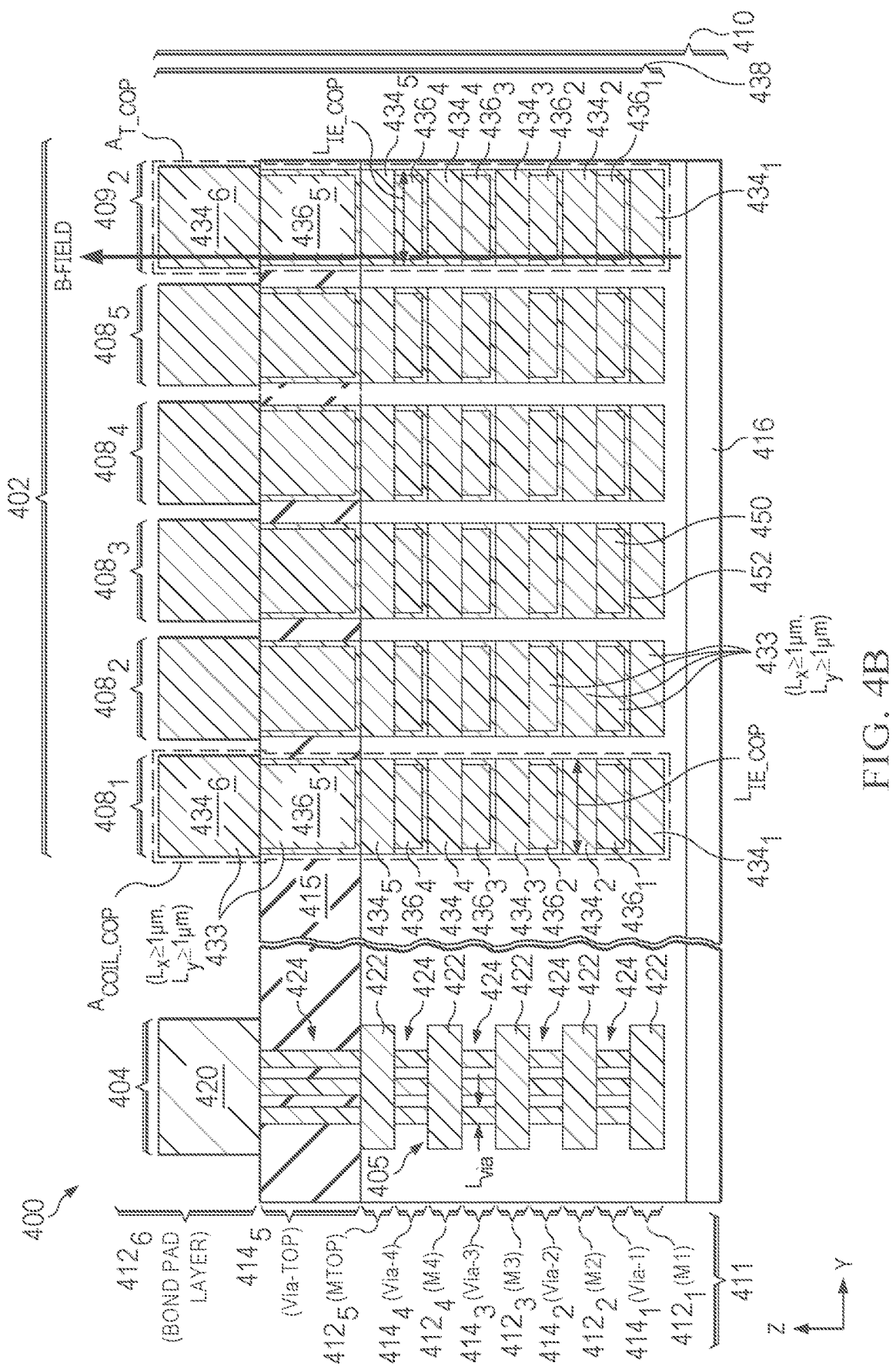

FIGS. 4A and 4B show an IC device 400 including another example spiral integrated inductor 402 and an example metal interconnect structure 404. FIG. 4A shows a top view of IC device 400, FIG. 4B shows a side cross-sectional view of IC device 400 through cut line 4B-4B shown in FIG. 4A. As shown in FIG. 4A, the spiral integrated inductor 402 includes an inductor wire 430 including five wire coils $408_1$-$408_5$ defining a spiral shape in the x-y plane, and a wire thickness (depth) in the z-direction. The inductor wire 430 extends between two inductor terminals $409_1$ and terminal $409_2$. FIG. 4B shows a cross-sectional view of the five wire coils $408_1$-$408_5$ and inductor terminal $409_2$ of the inductor wire 430, along with the example metal interconnect structure 404.

As shown in FIG. 4B, IC device 400 includes an IC layer stack 410 formed over substrate 416, e.g., a silicon substrate, extending in the x-y plane. The IC layer stack 410 may be formed directly on the substrate 416, or IC device 400 may include any number of intervening layers or structures (not shown) between the substrate 416 and the bottom of the IC layer stack 410.

The IC layer stack 410 includes a stack of IC layers 411 including multiple metal layers $412_1$-$412_6$ and multiple via layers $414_1$-$414_5$ formed in an alternating manner in a vertical direction (z-direction), with a respective via layer 414 located between a respective pair of metal layers 412. Metal layers $412_1$-$412_6$ and via layers $414_1$-$414_5$ are also referred to as metal layers 412 and via layers 414, respectively, for convenience.

In this example, metal layers $412_1$-$412_5$ are metal interconnect layers (referred to as M1, M2, M3, M4, M5, and MTOP, respectively) and metal layer $412_6$ is a bond pad layer, and via layers $414_1$-$414_6$ are interconnect via layers. Via layer $414_5$ (Via-top layer) may be formed in a passivation layer 415.

The number of metal layers 412 and via layers 414 shown in FIG. 4B are examples only. In other examples, IC layer stack 410 may include any other number of metal layers 412 and via layers 414. In addition, in some examples, IC layer stack 410 may be defined by a selected set of metal layers 412 and via layers 414 at any depth below the top of the IC device 400 (in the z-direction).

Still referring to FIG. 4B, the example metal interconnect structure 404 includes multiple interconnect elements 405 including (a) a bond pad 420 formed in bond pad layer $412_6$, (b) at least one metal layer interconnect element 422 formed in each metal interconnect layer $412_1$-$412_5$, and (c) at least one interconnect via 424 formed in each via layer $414_1$-$414_5$ and conductively connecting metal layer interconnect elements 422 of vertically adjacent metal interconnect layers $412_1$-$412_5$ (e.g., interconnect vias 424 formed in via layer 4143 conductively connects the respective metal layer interconnect elements 422 in vertically adjacent metal interconnect layers 4123 and 4124).

As noted above, FIG. 4B also shows a side cross-sectional view of the five wire coils $408_1$-$408_5$ and inductor terminal $409_2$. Each wire coil $408_1$-$408_5$ and inductor terminal $409_2$ is defined by a common inductor element stack 438 formed in the IC layer stack 410. The inductor element stack 438 includes a stack of conductively-connected inductor elements 433, including metal layer inductor elements $434_1$-$434_6$ formed respectively in metal layers $412_1$-$412_6$ and MC via layer inductor elements $436_1$-$436_5$ formed respectively in via layers $414_1$-$414_5$.

In some examples, bond pad layer $412_6$ and underlying metal layers $412_1$-$412_5$ may be formed from aluminum, and via layers $414_1$-$414_5$ may include multiple components formed from different metals. In the example shown in FIG. 4B, each interconnect via 424 may be formed from a first metal (e.g., tungsten or other conformal metal), and each MC via layer inductor element 436 may include (a) a via layer inductor element cup-shaped component 450 formed from the first metal (e.g., tungsten or other conformal metal) and (b) a via layer inductor element fill component 452 formed from a second metal (e.g., aluminum or titanium nitride).

As discussed below with reference to FIGS. 5A-5G, each MC via layer inductor element 436 may be formed together with an interconnect via 424 (or multiple interconnect via 424) by a dual-metal deposition process:

(a) depositing the first metal (e.g., tungsten or other conformal metal) to form (i) the interconnect via 424 in an interconnect via opening and (ii) the via layer inductor element cup-shaped component 450 in an inductor element tub opening, and (b) depositing the second metal (e.g., aluminum or titanium nitride) over the first metal and extending into an opening defined by the via layer inductor element cup-shaped component 450, to define the via layer inductor element fill component 452.

In some examples, aluminum (or titanium nitride) may be used as the second metal for forming the via layer inductor element fill component 452. As discussed above, aluminum may provide various advantages as the fill metal, for example to provide costs savings relative to using copper as the fill metal. However, in other examples, copper or other metal may be used as the second metal for forming the via layer inductor element fill component 452.

In some examples, the inductor wire 430 exhibits low resistance characteristics. For example, in some examples the inductor wire 430 has a sheet resistance of less than 10 mΩ/sq. In some examples, the inductor wire 430 has a sheet resistance of less than 3 mΩ/sq.

In some examples, the low resistance characteristics of the inductor wire 430 are defined at least by the wire thickness of the inductor wire 430. As discussed above regarding inductor wires 130, 330 and 430, the wire thickness of inductor wire 430 may be defined by specified dimensions of the inductor wire in the current-orthogonal plane COP.

With reference to FIG. 4B, in some examples each inductor element 433 (including each metal layer inductor element 434 and each MC via layer inductor element 436) has a length $L_{IE\_COP}$ in the current-orthogonal plane COP (the length being orthogonal to the z-direction) of least 1 µm, at least 2 µm, at least 5 µm, at least 10 µm, or at least 100 µm (depending on the particular example) along the full length of the inductor wire 430, e.g., along coils 408₁-408₅ and terminals 409₁ and 409₂. Thus, with reference to FIG. 4B, each inductor element 433 of inductor wire 430 has a respective length $L_{IE\_COP}$ of at least 1 µm, at least 2 µm, at least 5 µm, at least 10 µm, or at least 100 µm, depending on the particular example. In some examples, each inductor element 433 (including each metal layer inductor element 434 and each MC via layer inductor element 436) in inductor wire 430 has a length $L_{IE\_COP}$ of at least 2 µm, at least 5 µm, at least 10 µm, or at least 100 µm, while each interconnect via 424 has a corresponding a length $L_{via}$ of less than 0.5 µm in the respective COP.

In some examples, the inductor wire 430 has an area of at least 5 µm², at least 10 µm², or at least 100 µm² in the current-orthogonal plane COP, referred to as the COP area, along the full length of the inductor wire 430, e.g., along coils 408₁-408₅ and terminals 409₁ and 409₂. Thus, referring to FIG. 4B, each of (a) the COP area $A_{COIL\_COP}$ along each coils 408₁-408₅ and (b) the COP area $A_{T\_COP}$ of terminal 409₂ is at least 5 µm², at least 10 µm², or at least 100 µm².

As discussed above, each of the example integrated inductors 102, 302, 402, and 402 includes a thick inductor wire defined by inductor element stacks including wide metal layer inductor elements and wide via layer inductor elements, e.g., each metal layer inductor element and each via layer inductor element having a length of at least 1 µm, at least 2 µm, at least 5 µm, at least 10 µm, or at least 100 µm in at least one lateral direction. As discussed below, metal layer inductor elements may be formed concurrently with metal layer interconnect elements in respective metal interconnect layers, and via layer inductor elements may be formed concurrently with interconnect vias in respective interconnect via layers. In some examples, wide via layer inductor elements (e.g., having a length of at least 1 µm, at least 2 µm, at least 5 µm, at least 10 µm, or at least 100 µm in at least one lateral direction) may be formed concurrently with conventional sized interconnect vias (e.g., having a length of less than 0.5 µm in two orthogonal lateral directions).

FIGS. 5A-5G show a series of side cross-sectional views of an example IC device 500 showing an example process for constructing a vertically-extending inductor element stack 538 (e.g., for construction of the example integrated inductor 102, 302, or 402 discussed above) concurrently with construction of a typical interconnect structure 502. The example process involves damascene process steps, as discussed below.

First, as shown in FIG. 5A, a metal interconnect layer $M_x$ is constructed over a substrate 516, e.g., silicon substrate. IC device 500 may include any number of intervening layers or structures 540 (including transistors and/or other IC elements) between the substrate 516 and the metal interconnect layer $M_x$, in the vertical direction (z-direction). Metal interconnect layer $M_x$ may include a metal layer interconnect element 522$_x$ and a metal layer inductor element 534$_x$, which may be formed in any suitable manner. For example, an aluminum layer may be deposited and selectively etched to define metal layer interconnect element 522$_x$ and metal layer inductor element 534$_x$. The metal layer inductor element 534$_x$ may have a length of at least 1 µm, at least 2 µm, at least 5 µm, at least 10 µm, or at least 100 µm, in the x-direction and/or the y-direction, depending on the particular implementation.

As shown in FIG. 5B, a dielectric region 542 is deposited over the metal layer interconnect element 522$_x$ and metal layer inductor element 534$_x$, followed by a chemical mechanical planarization (CMP) process to planarize a top surface of the dielectric region 542. In some examples, dielectric region 542 comprises an oxide, e.g., deposited using high density plasma (HDP) and plasma enhanced chemical vapor deposition (PECVD) deposition processes.

Next, as shown in FIGS. 5C-5F, an interconnect via 524 and a MC via layer inductor element 536$x$ are concurrently formed in a via layer $Via_x$ using a single damascene process.

Figure 5C:
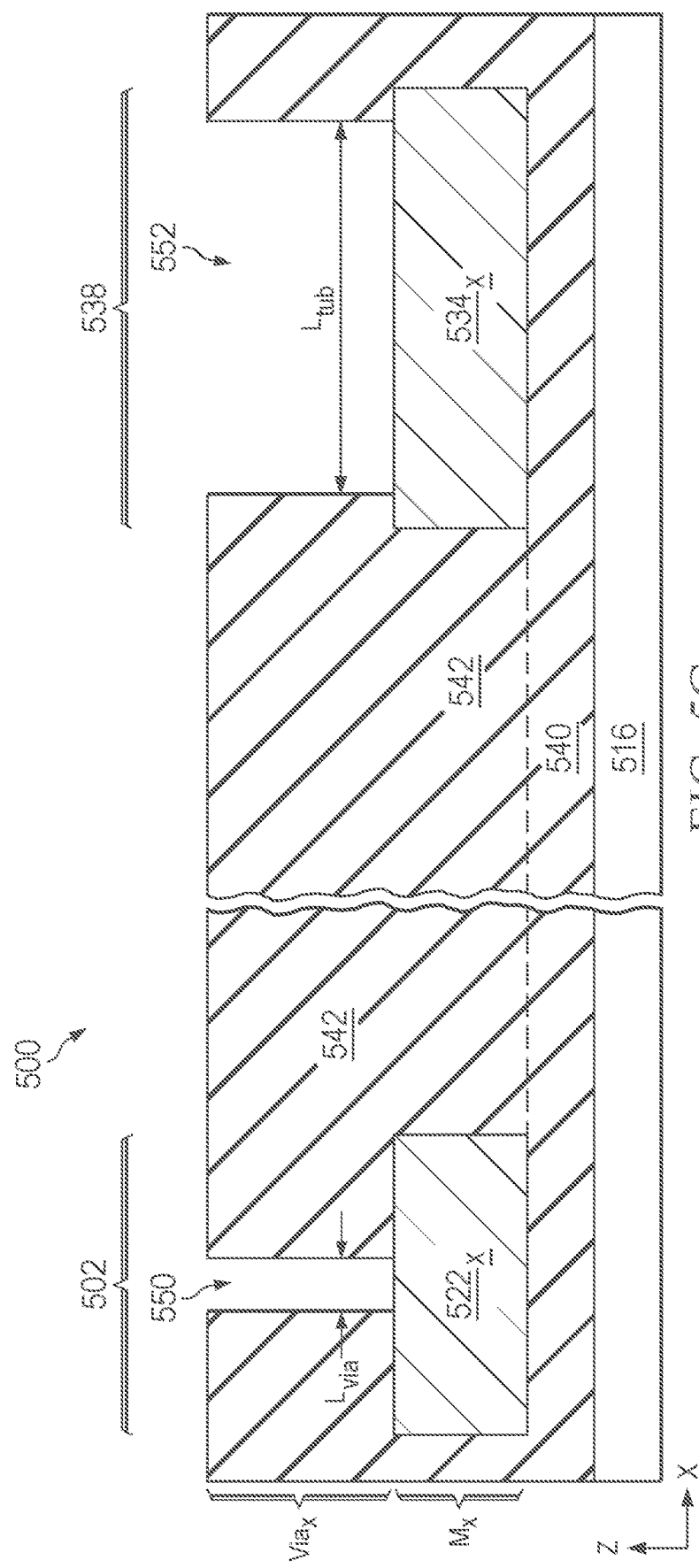

First, as shown in FIG. 5C, the dielectric region 542 is patterned and etched (e.g., using a plasma etch) to concurrently form at least one interconnect via opening 550 exposing a top surface of the metal layer interconnect element 522$x$ and a tub opening 552 exposing a top surface of the metal layer inductor element 534$x$. Interconnect via opening 550 may be formed as narrow via opening with a length $L_{via}$ in both the x-direction and y-direction of less than 0.5 µm, e.g., between 0.1 and 0.5 µm. In contrast, tub opening 552 may have a substantially larger x-direction length ($L_{thb}$) and y-direction length (not shown) than interconnect via opening 550. For example, tub opening 552 may have an x-direction length $L_{tub}$ and a y-direction length (not shown) of at least 1 µm, at least 2 µm, at least 5 µm, at least 10 µm, or at least 100 µm, depending on the particular implementation.

Figure 5D:
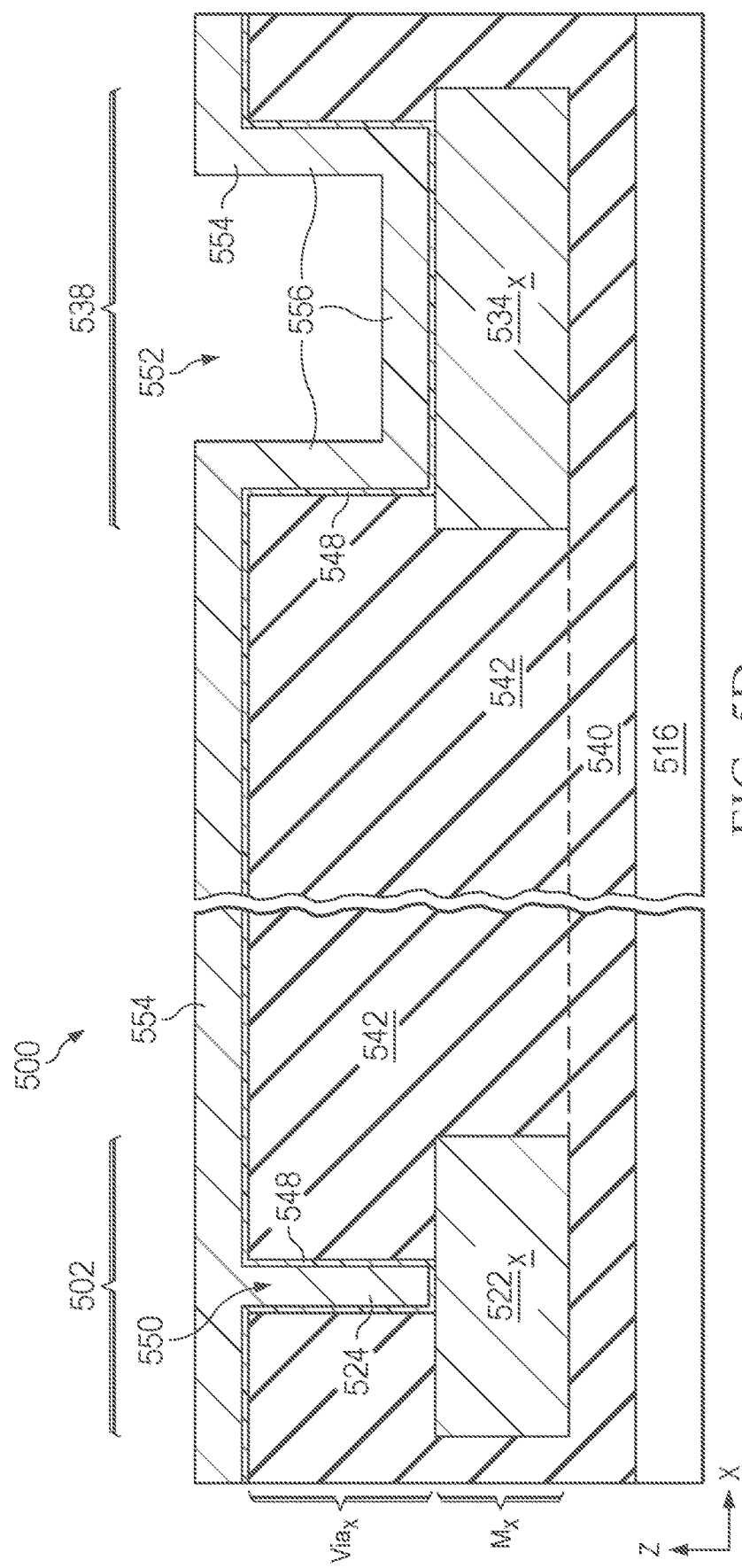

Next, as shown in FIG. 5D, a barrier layer 548, e.g., comprising a titanium/titanium nitride (Ti/TiN) bilayer, is deposited in the interconnect via opening 550 and tub opening 552. A conformal metal layer 554 (e.g., tungsten or other conformal metal) is then deposited over the barrier layer 548 and extending into the interconnect via opening 550 and tub opening 552, to (a) form interconnect via 524 in the interconnect via opening 550 and (b) form a via layer inductor element cup-shaped component 556 in the tub opening 552. In one example, conformal metal layer 554 may comprise tungsten. Due to inherent tensile stresses in deposited tungsten, a tungsten layer with a thickness above about 5000 Å may result in peeling of the tungsten layer or wafer breakage during subsequent process steps. Thus, conformal metal layer 554 comprising tungsten may be limited to a thickness of about 5000 Å (which is insufficient to fill the tub opening 552, thus resulting in the via layer inductor element cup-shaped component 556). For example, metal layer 554 may comprise a tungsten layer having a thickness in the range of 1000 Å-5000 Å, deposited using a chemical vapor deposition (CVD) process.

Figure 5E:
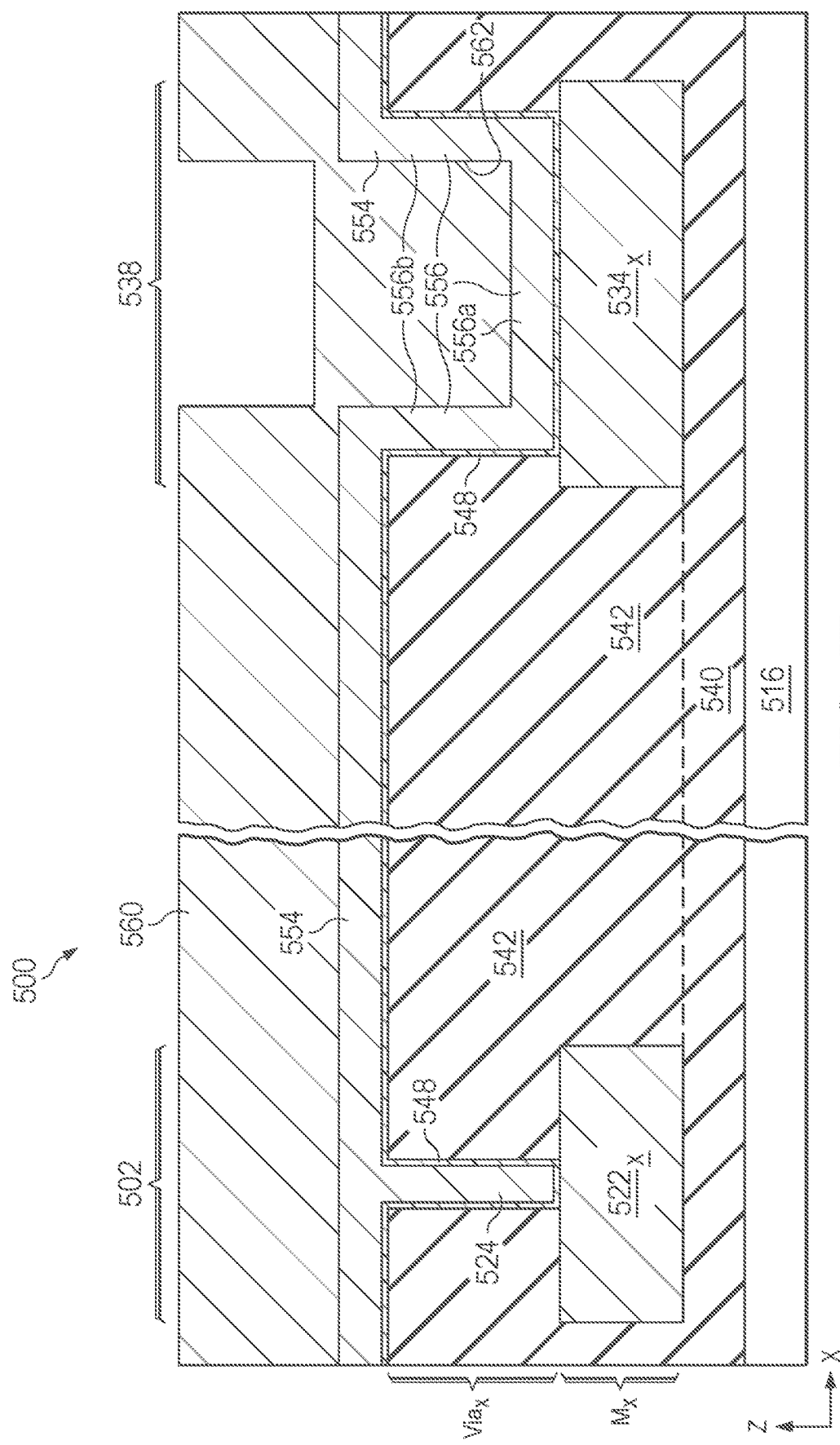

Next, as shown in FIG. 5E, a fill metal layer 560 is deposited over conformal metal layer 554, and forms a via layer inductor element fill component 564 that fills an interior opening 562 defined by the via layer inductor element cup-shaped component 556. In some examples, the fill metal layer 560 may comprise aluminum, titanium nitride (TiN), or other suitable fill metal. As discussed above, in some example aluminum may provide various advantages as the fill metal layer 560, for example to provide cost savings relative to copper. However, in other examples, the fill metal layer 560 may comprise copper or other metal(s).

Figure 5F:
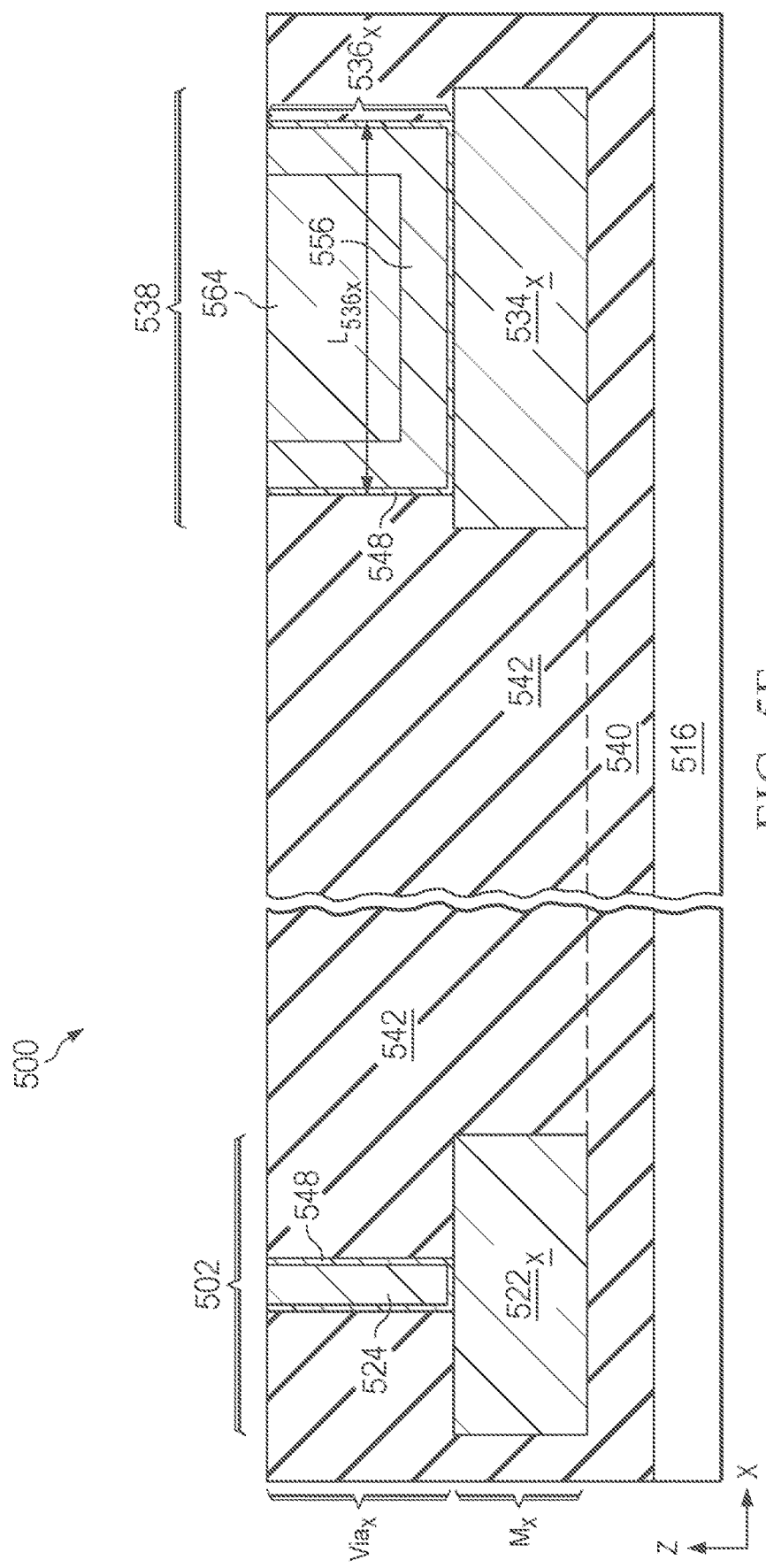

Next, as shown in FIG. 5F, a CMP process may be performed to remove portions of conformal metal layer 554 and fill metal layer 560 outside the interconnect via opening 550 and tub opening 552, and planarize a top surface of the structure. The remaining via layer inductor element cup-shaped component 556 and via layer inductor element fill component 564 collectively define a MC via layer inductor element $536_x$ in the via layer $Via_x$. MC via layer inductor element $536_x$ may have a length $L_{536x}$ of at least 1 µm, at least 2 µm, at least 5 µm, at least 10 µm, or at least 100 µm in the x-direction and/or y-direction, depending on the particular example.

The process may continue by constructing additional elements of the interconnect structure 502 and vertically-extending inductor element stack 538 in a next metal interconnect layer $M_{x+1}$. For example, as shown in FIG. 5G, a metal layer interconnect element $522_{x+1}$ and a metal layer inductor element $534_{x+1}$ may be formed over the interconnect via 524 and MC via layer inductor element $536_x$, respectively. In one example, an aluminum layer may be deposited and selectively etched to define metal layer interconnect element $522_{x+1}$ conductively connected with the underlying interconnect via 524, and metal layer inductor element $534_{x+1}$ conductively connected with the underlying MC via layer inductor element $536_x$.

This process may be repeated to form additional via layer inductor elements 536 and metal layer inductor elements 534 in additional via layers and metal interconnect layers, respectively, to form a desired vertical thickness (z-direction) of the respective inductor element stack 538.

FIGS. 6A-6G show a series of side cross-sectional views of an example IC device 600 showing an example process for constructing an inductor element stack 638 extending both vertically and laterally (e.g., for construction of the example integrated inductor 202 discussed above), concurrently with construction of a typical interconnect structure 602. The example process involves damascene process steps, as discussed below.

First, as shown in FIG. 6A, a metal interconnect layer $M_x$ is constructed over a substrate 616, e.g., silicon substrate. IC device 600 may include any number of intervening layers or structures 640 (including transistors and/or other IC elements) between the substrate 616 and the metal interconnect layer $M_x$, in the vertical direction (z-direction). Metal interconnect layer $M_x$ may include a metal layer interconnect element $622_x$ and a metal layer inductor element $634_x$, which may be formed in any suitable manner. For example, an aluminum layer may be deposited and selectively etched to define metal layer interconnect element $622_x$ and metal layer inductor element $634_x$. The metal layer inductor element $634_x$ may have a length of at least 1 µm, at least 2 µm, at least 5 µm, at least 10 µm, or at least 100 µm, in the x-direction and/or the y-direction, depending on the particular implementation.

As shown in FIG. 6B, a dielectric region 642 is deposited over the metal layer interconnect element $622_x$ and metal layer inductor element $634_x$, followed by a chemical mechanical planarization (CMP) process to planarize a top surface of dielectric region 642. In some examples, dielectric region 642 comprises an oxide, e.g., deposited using HDP and PECVD deposition processes.

Next, as shown in FIGS. 6C-6F, an interconnect via 624 and a MC via layer inductor element $636_x$ are concurrently formed in a via layer $Via_x$ using a single damascene process.

Figure 6C:
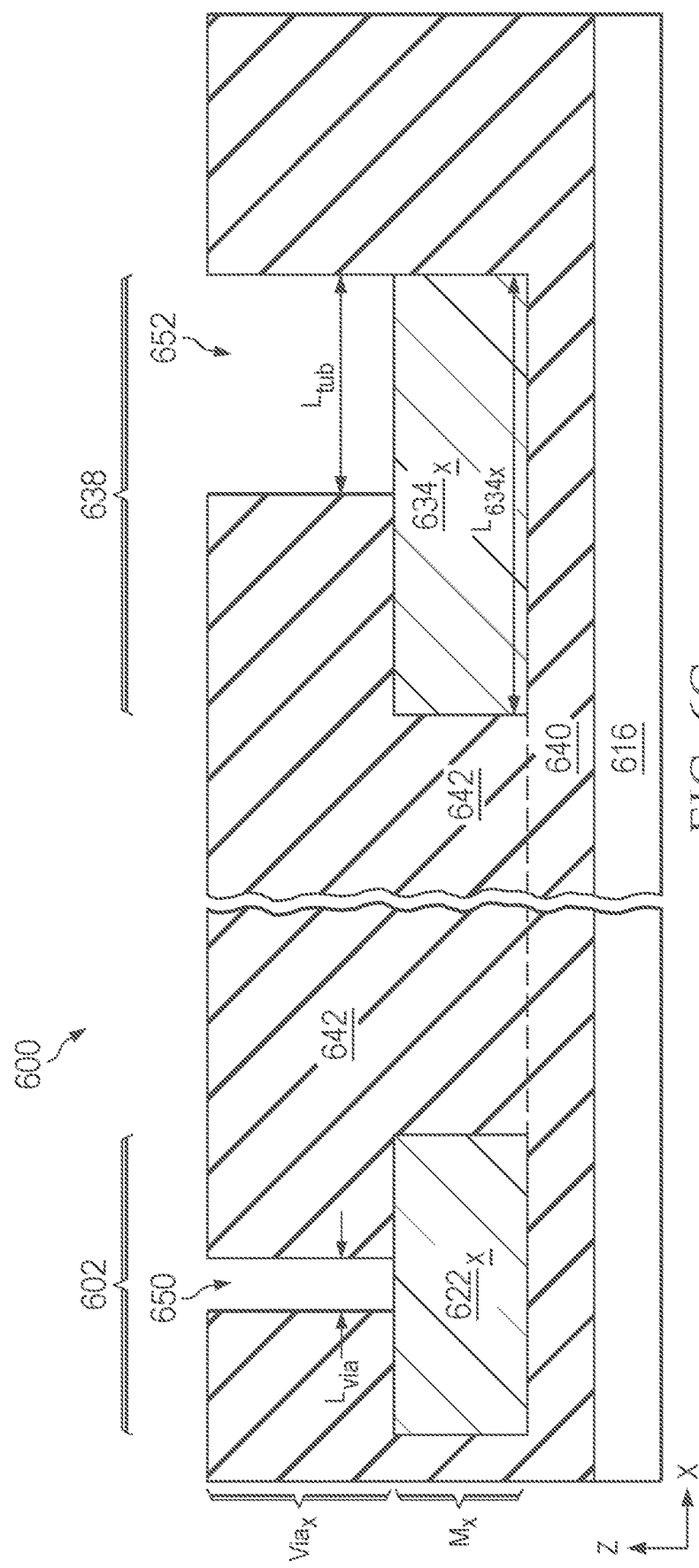

First, as shown in FIG. 6C, dielectric region 642 is patterned and etched (e.g., using a plasma etch) to concurrently form at least one interconnect via opening 650 exposing a top surface of the metal layer interconnect element $622_x$ and a tub opening 652 exposing a top surface of the metal layer inductor element $634_x$. Interconnect via opening 650 may be formed as narrow via opening with a length $L_{via}$ in both the x-direction and y-direction of less than 0.5 µm, e.g., between 0.1 and 0.5 µm. In contrast, tub opening 652 may have a substantially larger x-direction length ($L_{tub}$) and y-direction with (not shown) than interconnect via opening 650. For example, tub opening 652 may have an x-direction length $L_{tub}$ and a y-direction length (not shown) of at least 1 µm, at least 2 µm, at least 5 µm, at least 10 µm, or at least 100 µm, depending on the particular implementation.

As shown, tub opening 652 may extend only partially over the metal layer inductor element $634_x$ in the x-direction, and may be laterally aligned toward one side of the underlying metal layer inductor element $634_x$ in the x-direction. For example, a length $L_{tub}$ of tub opening 652 in the x-direction may be less than 90%, less than 75%, or less than 50% of a length $L634_x$ of metal layer inductor element $634_x$ in the x-direction.

Figure 6D:
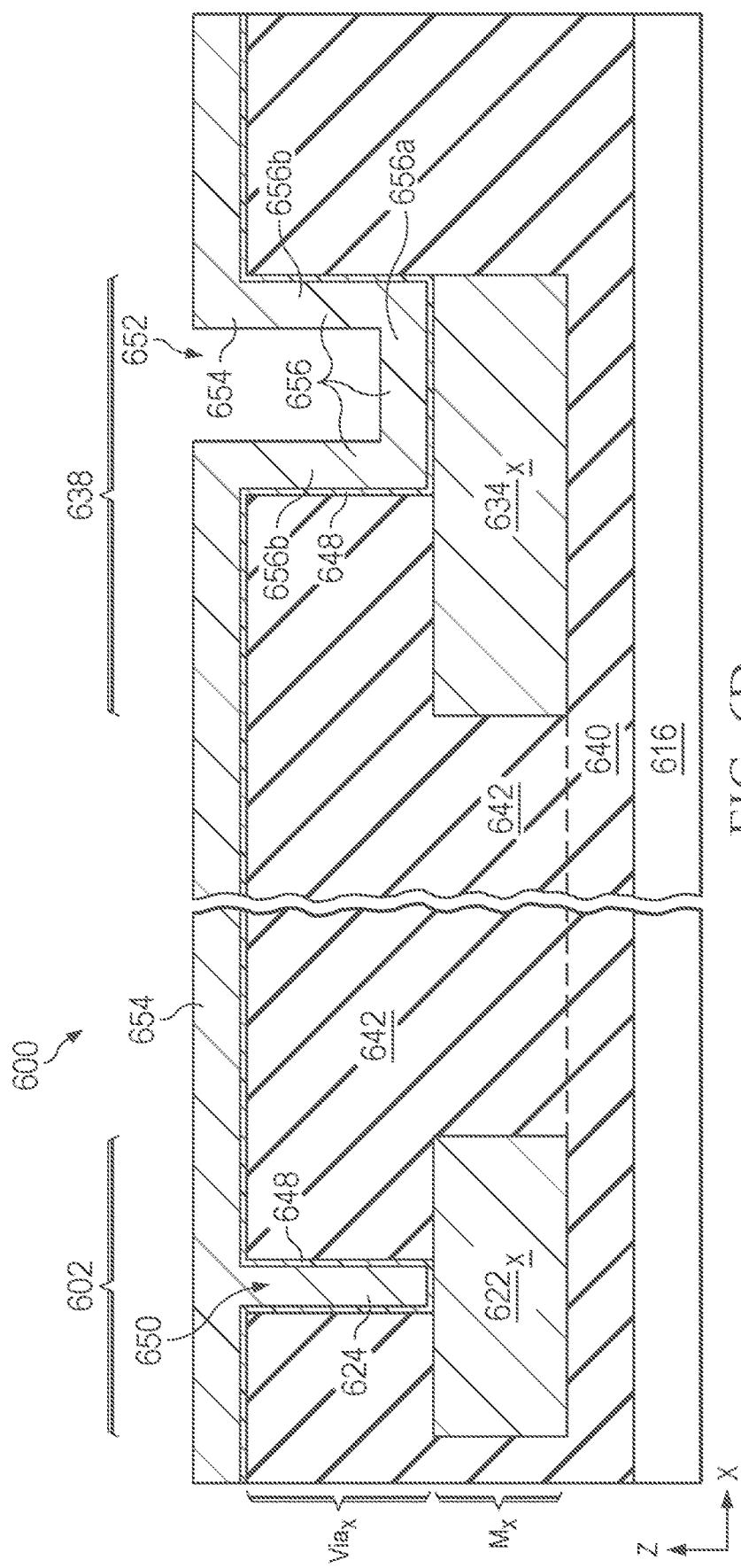

Next, as shown in FIG. 6D, a barrier layer 648, e.g., comprising a titanium/titanium nitride (Ti/TiN) bilayer, is deposited in the interconnect via opening 650 and tub opening 652. A conformal metal layer 654 (e.g., tungsten or other conformal metal) is then deposited over the barrier layer 648 extending into the interconnect via opening 650 and tub opening 652, to (a) form interconnect via 624 in the interconnect via opening 650 and (b) form a via layer inductor element cup-shaped component 656 in the tub opening 652. In one example, conformal metal layer 654 may comprise tungsten. For example, metal layer 654 may comprise a tungsten layer having a thickness in the range of 1000 Å-5000 Å, deposited using a CVD process.

Next, as shown in FIG. 6E, a fill metal layer 660 is deposited over conformal metal layer 654, and fills an interior opening 662 defined by the via layer inductor element cup-shaped component 656 to form a via layer inductor element fill component 664. In some examples, the fill metal layer 660 may comprise aluminum, titanium nitride (TiN), or other suitable fill metal. As discussed above, in some example aluminum may provide various advantages as the fill metal layer 660, for example to provide costs savings relative to copper. However, in other examples, the fill metal layer 660 may comprise copper or other metal(s).

Figure 6F:
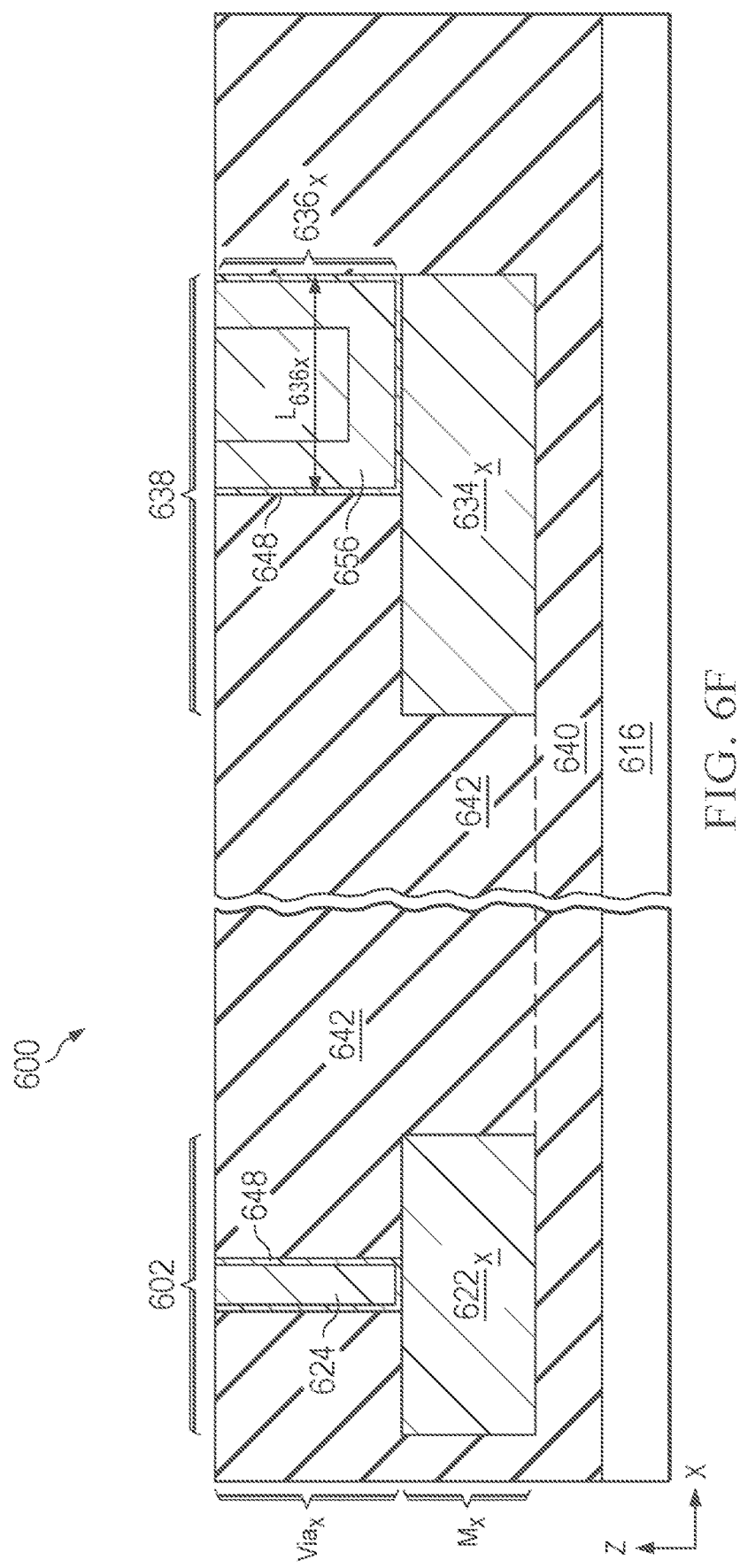

Next, as shown in FIG. 6F, a CMP process may be performed to remove portions of conformal metal layer 654 and fill metal layer 660 outside the interconnect via opening 650 and tub opening 652, and planarize a top surface of the structure. The remaining via layer inductor element cup-shaped component 656 and via layer inductor element fill component 664 collectively define a MC via layer inductor element $636_x$ in the via layer $Via_x$. MC via layer inductor element $636_x$ may have a length $L_{636x}$ of at least 1 µm, at least 2 µm, at least 5 µm, at least 10 µm, or at least 100 µm in the x-direction and/or y-direction, depending on the particular example.

Figure 6G:
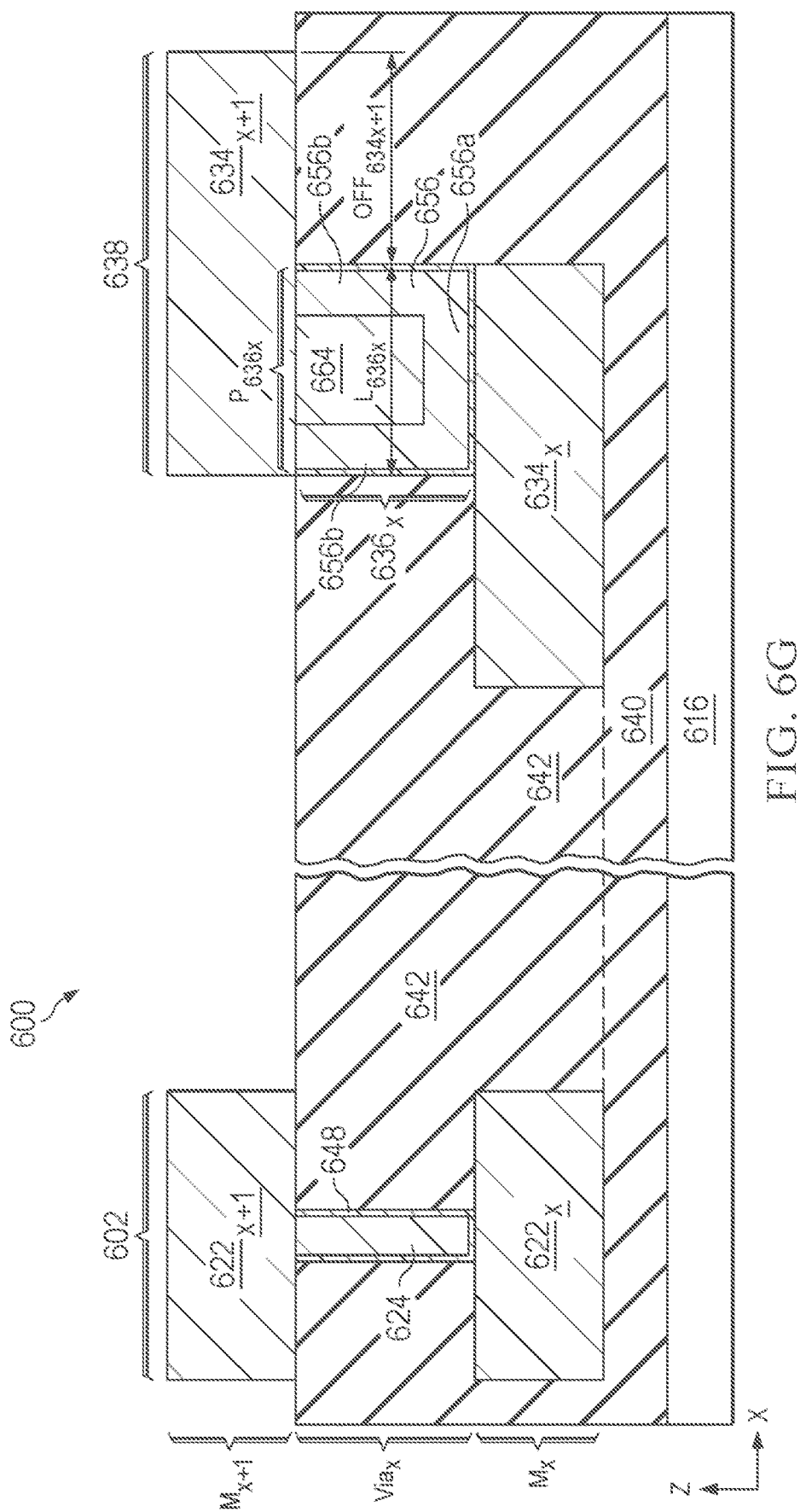

The process may continue by constructing additional elements of the interconnect structure 602 and diagonally-extending inductor element stack 638 in a next metal interconnect layer $M_{x+1}$. For example, as shown in FIG. 6G, a metal layer interconnect element $622_{x+1}$ and a metal layer inductor element $634_{x+1}$ may be formed over the interconnect via 624 and MC via layer inductor element $636_x$, respectively. In one example, an aluminum layer may be deposited and selectively etched to define metal layer interconnect element $622_{x+1}$ conductively connected with the underlying interconnect via 624, and metal layer inductor element $634_{x+1}$ conductively connected with the underlying MC via layer inductor element $636_x$.

As shown, the metal layer inductor element $634_{x+1}$ fully covers an outer perimeter $P_{636x}$ of a top surface of the MC via layer inductor element $636_x$, and extends beyond the outer perimeter $P_{636x}$ by an offset distance $OFF_{634x+1}$ of at least 1 µm, at least 2 µm, at least 5 µm, at least 10 µm, or at least 100 µm, in the x-direction (and/or in the y-direction), depending on the particular example. In some examples, the offset distance $OFF_{634x+1}$ is at least 10%, at least 25%, at least 50%, or at least 100% of the length $L_{636x}$ of underlying via layer inductor element $636_x$, depending on the particular example.

This process may be repeated to form additional via layer inductor elements 636 and metal layer inductor elements 634 in additional via layers and metal interconnect layers, respectively, to form a desired vertical thickness (z-direction) and lateral length (x-direction) of the respective inductor element stack 638.

The invention claimed is:

1. A device, comprising:
an integrated circuit (IC) structure including multiple metal interconnect layers and multiple via layers formed in an alternating manner in a vertical direction, with respective via layers located between a respective pair of the metal interconnect layers;
an integrated inductor comprising an inductor wire, wherein at least a portion of the inductor wire is defined by an inductor element stack including:
a metal layer inductor element formed in a respective metal interconnect layer in the IC structure; and
a multi-component via layer inductor element formed in a respective via layer in the IC structure vertically adjacent the respective metal interconnect layer, the multi-component via layer inductor element conductively connected to the metal layer inductor element;
the multi-component via layer inductor element comprising:
a via layer inductor element cup-shaped component formed from a first metal;
a via layer inductor element fill component formed from a second metal different than the first metal, the via layer inductor element fill component formed in an opening defined by the via layer inductor element cup-shaped component;
a metal interconnect structure including:
a metal layer interconnect element formed in the respective metal interconnect layer; and
an interconnect via formed in the respective via layer and conductively coupled to the metal layer interconnect element, the interconnect via formed from the first metal and free of the second metal.

2. The device of claim 1, wherein:
the first metal comprises tungsten; and
the second metal comprises aluminum or titanium nitride.

3. The device of claim 1, wherein:
the second metal comprises aluminum; and
the metal layer inductor element and the metal layer interconnect element are formed from aluminum.

4. The device of claim 1, wherein the multi-component via layer inductor element has a length of at least 1 µm in each of two lateral directions orthogonal to each other and perpendicular to the vertical direction.

5. The device of claim 4, wherein the interconnect via has a length less than 1 µm in at least one of the two lateral directions.

6. The device of claim 1, wherein:
the multi-component via layer inductor element has a length greater than 2 µm in each of two lateral directions orthogonal to each other and perpendicular to the vertical direction; and
the interconnect via has length less than 0.5 µm in at least one of the two lateral directions.

7. The device of claim 1, wherein the inductor wire has a sheet resistance of less than 10 mΩ/sq.

8. The device of claim 1, wherein the inductor wire has a sheet resistance of less than 3 mΩ/sq.

9. The device of claim 1, wherein the inductor element stack including the metal layer inductor element and the multi-component via layer inductor element defines a diagonally-extending wire segment of the inductor wire, the diagonally-extending wire segment extending diagonally with respect to the vertical direction.

10. The device of claim 1, wherein the integrated inductor comprises a spiral inductor, wherein the inductor wire has a spiral shape.

11. The device of claim 1, wherein:
the inductor element stack is formed over a silicon substrate; and
a magnetic B-field of the integrated inductor extends parallel to the silicon substrate.

12. The device of claim 1, wherein:
the inductor element stack is formed over a silicon substrate; and
a magnetic B-field of the integrated inductor extends perpendicular to the silicon substrate.

13. A method, comprising:
forming, in a metal interconnect layer of an integrated circuit (IC) structure, (a) a metal layer interconnect element of a metal interconnect structure and (b) a metal layer inductor element of an integrated inductor; and
forming, in a via layer adjacent the metal interconnect layer in a vertical direction, (a) an interconnect via of the metal interconnect structure and (b) a multi-component via layer inductor element of the integrated inductor wire by:

forming multiple via layer openings in a dielectric region, the multiple via layer openings including an interconnect via opening and a tub opening, wherein the tub opening has a length of at least 1 μm in each of two lateral directions orthogonal to each other and perpendicular to the vertical direction, and the interconnect via has a length of less than 1 μm in at least one of the two lateral directions;

depositing a conformal metal over the dielectric region and (a) extending into and fully filing the interconnect via opening to form an interconnect via and (b) extending into and partially filing the tub opening to form a via layer inductor element cup-shaped component; and depositing a fill metal over the conformal metal and extending into an interior opening defined by the via layer inductor element cup-shaped component to form a via layer inductor element fill component; and removing portions of the conformal metal and the fill metal outside the via layer openings.

14. The method of claim 13, comprising forming the interconnect via element and the multi-component via layer inductor element in the respective via layer by a single damascene process.

15. The method of claim 13, wherein:
the conformal metal comprises tungsten; and
the fill metal comprises aluminum or titanium nitride.

16. The method of claim 13, comprising:
forming, in a further metal interconnect layer of the multiple metal interconnect layers, the further metal interconnect layer located above the respective via layer, a further metal layer inductor element conductively connected with the multi-component via layer inductor element,
wherein the further metal layer inductor element fully covers an outer perimeter of a top surface of the multi-component via layer inductor element, and extends beyond the outer perimeter of the top surface of the multi-component via layer inductor element by at least 1 μm in at least one of the two lateral directions.

17. A device, comprising:
an integrated circuit (IC) layer stack formed over a silicon substrate;
the IC layer stack including multiple metal layers and multiple via layers formed in an alternating manner in a vertical direction, with respective via layers located between a respective pair of the metal layers; and
an integrated inductor wire coil comprising;
  a lower laterally-extending wire segment formed in a first layer of the multiple metal layers of the IC layer stack;
  an upper laterally-extending wire segment formed in a second layer of the multiple metal layers of the IC layer stack; and
  a vertically-extending wire segment formed in the IC layer stack and conductively connecting the lower laterally-extending wire segment with the upper laterally-extending wire segment;
  wherein the vertically-extending wire segment comprises an inductor element stack including:
    a metal layer inductor element formed in a respective metal layer in the IC layer stack; and
    a multi-component via layer inductor element formed in a respective via layer adjacent the respective metal layer and conductively connected to the metal layer inductor element;
  wherein the multi-component via layer inductor element includes:
    a via layer inductor element cup-shaped component formed from a first metal;
    a via layer inductor element fill component formed from a second metal, the fill component formed in an opening defined by the cup-shaped component;
  wherein the inductor wire coil defines a magnetic B-field extending parallel to the silicon substrate.

18. The device of claim 17, wherein the vertically-extending wire segment extends diagonally with respect to the vertical direction.

19. The device of claim 17, wherein the multi-component via layer inductor element has a length of at least 1 μm in each of two lateral directions orthogonal to each other and perpendicular to the vertical direction.

20. The device of claim 1, wherein:
the via layer inductor element cup-shaped component and the interconnect via comprise respective portions of a layer of the first metal; and
the via layer inductor element fill component comprises a portion of a layer of the second metal formed over the first metal.

* * * * *